(12) United States Patent
Selmo

(10) Patent No.: US 10,879,043 B2
(45) Date of Patent: Dec. 29, 2020

(54) DEVICE INTRINSICALLY DESIGNED TO RESONATE, SUITABLE FOR RF POWER TRANSFER AS WELL AS GROUP INCLUDING SUCH DEVICE AND USABLE FOR THE PRODUCTION OF PLASMA

(71) Applicants: Antonio Franco Selmo, Verona (IT); Daniele Pavarin, Padua (IT); Fabio Trezzolani, Verona (IT); Marco Manente, Padua (IT)

(72) Inventor: Antonio Franco Selmo, Verona (IT)

(73) Assignees: Antonio Franco Selmo, Verona (IT); Fabio Trezzolani, Verona (IT); Daniele Pavarin, Padua (IT); Marco Manente, Padua (IT)

( * ) Notice: Subject to any disclaimer, the term of this patent is extended or adjusted under 35 U.S.C. 154(b) by 207 days.

(21) Appl. No.: 15/543,744

(22) PCT Filed: Jan. 15, 2016

(86) PCT No.: PCT/IB2016/050199
§ 371 (c)(1),
(2) Date: Jul. 14, 2017

(87) PCT Pub. No.: WO2016/113707
PCT Pub. Date: Jul. 21, 2016

(65) Prior Publication Data
US 2018/0269035 A1 Sep. 20, 2018

(30) Foreign Application Priority Data
Jan. 16, 2015 (IT) .............................. VR2015A0007

(51) Int. Cl.
*H01J 37/32* (2006.01)
*H05H 1/24* (2006.01)
*H05H 1/46* (2006.01)

(52) U.S. Cl.
CPC ..... *H01J 37/3211* (2013.01); *H01J 37/32174* (2013.01); *H01J 37/32183* (2013.01); *H05H 1/24* (2013.01); *H05H 2001/4667* (2013.01)

(58) Field of Classification Search
None
See application file for complete search history.

(56) References Cited

U.S. PATENT DOCUMENTS

| | | | | |
|---|---|---|---|---|
| 5,174,924 A * | 12/1992 | Yamada | ................... | C08K 3/04 252/502 |
| 6,291,938 B1 * | 9/2001 | Jewett | ............... | H01J 37/32009 156/345.48 |

(Continued)

*Primary Examiner* — Crystal L Hammond
(74) *Attorney, Agent, or Firm* — Duane Morris LLP; Gregory M. Lefkowitz; Jason. M. Nolan

(57) ABSTRACT

The present invention regards a device intrinsically designed to resonate, suitable for RF power transfer, particularly usable for the production of plasma and electrically connectable downstream of a radio frequency power supply with fixed or variable frequency, comprising at least one inductive element (Lp), which can be powered, during use, by such at least one power supply; at least one capacitive element (Cp) electrically connected at the terminals of such at least one inductive element (Lp); such at least one device having a resonance angular frequency equal to: $\omega_0 = 1/\sqrt{L_p C_p}$. The capacitive element (Cp) and the inductive element (Lp) have values such that, at resonance state, they provide an equivalent impedance, measured at the terminals of such device, substantially of resistive type and much greater than the value of the parasitic impedance upstream of such terminals of such device, such that the effect of such parasitic impedance is, during use, substantially negligible.

35 Claims, 19 Drawing Sheets

(56) References Cited

U.S. PATENT DOCUMENTS

| | | | |
|---|---|---|---|
| 8,438,990 B2* | 5/2013 | Kudela | C23C 16/5096 |
| | | | 118/723 E |
| 2004/0124779 A1* | 7/2004 | Howald | H01J 37/321 |
| | | | 315/111.51 |
| 2004/0255863 A1* | 12/2004 | Higashiura | H01J 37/32082 |
| | | | 118/723 E |
| 2004/0263412 A1 | 12/2004 | Pribyl | |
| 2009/0154202 A1* | 6/2009 | Takatsuka | H05B 41/2828 |
| | | | 363/40 |
| 2011/0000783 A1* | 1/2011 | Ohmi | C23C 14/35 |
| | | | 204/192.15 |
| 2013/0088146 A1 | 4/2013 | Matsuda et al. | |
| 2014/0302256 A1* | 10/2014 | Chen | C23C 16/5096 |
| | | | 427/569 |
| 2015/0235809 A1* | 8/2015 | Ito | H01J 37/32165 |
| | | | 156/345.48 |

* cited by examiner

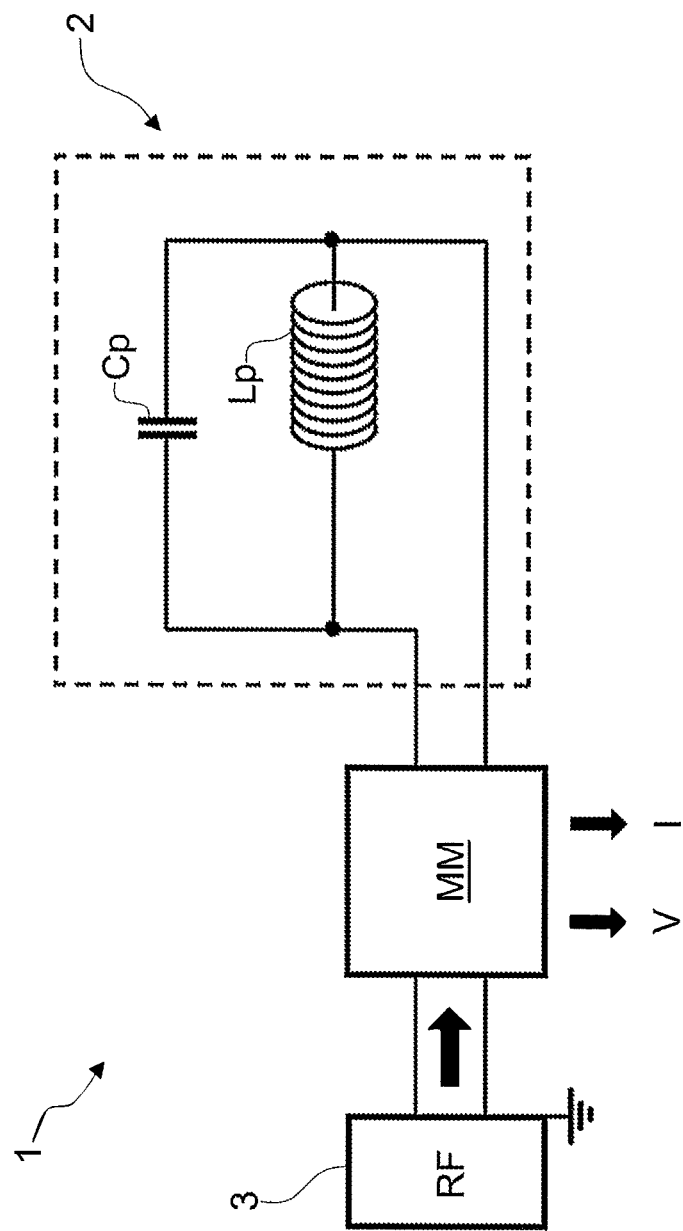

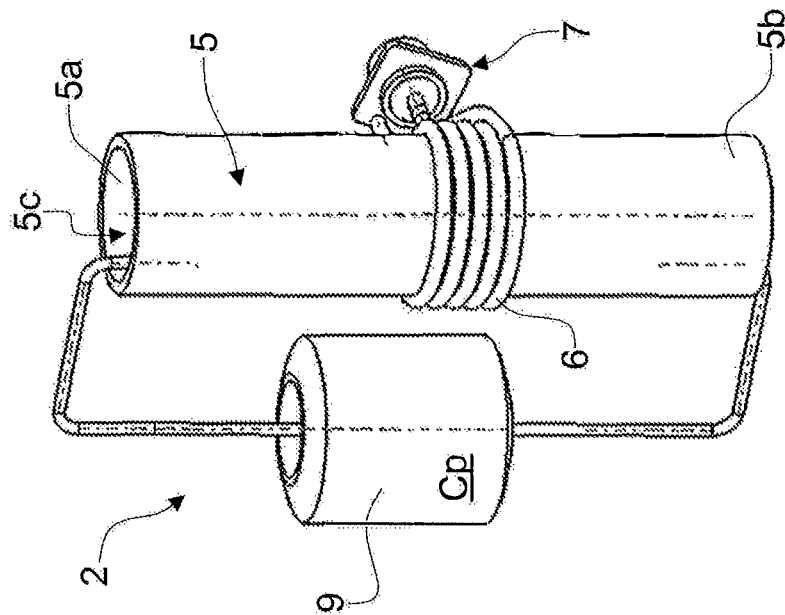
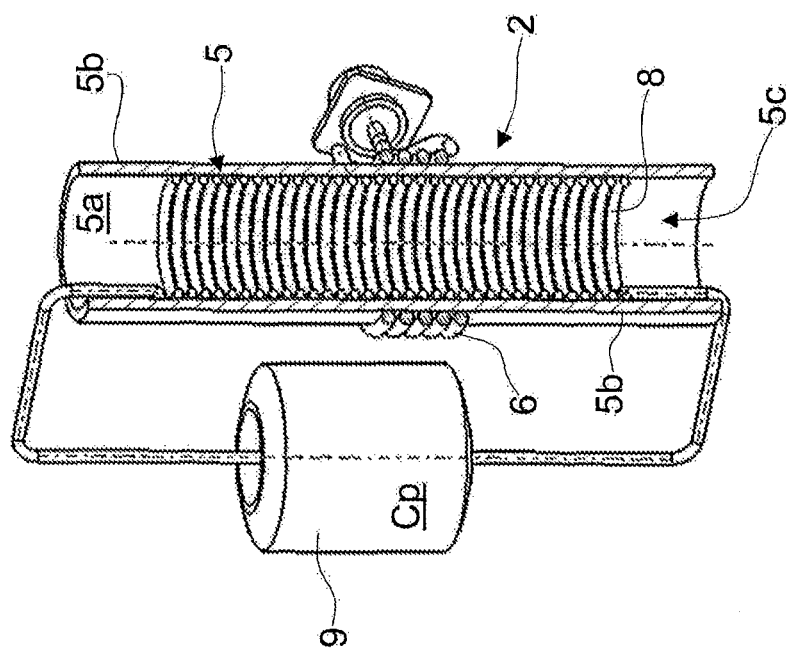
FIG. 2b
FIG. 2a

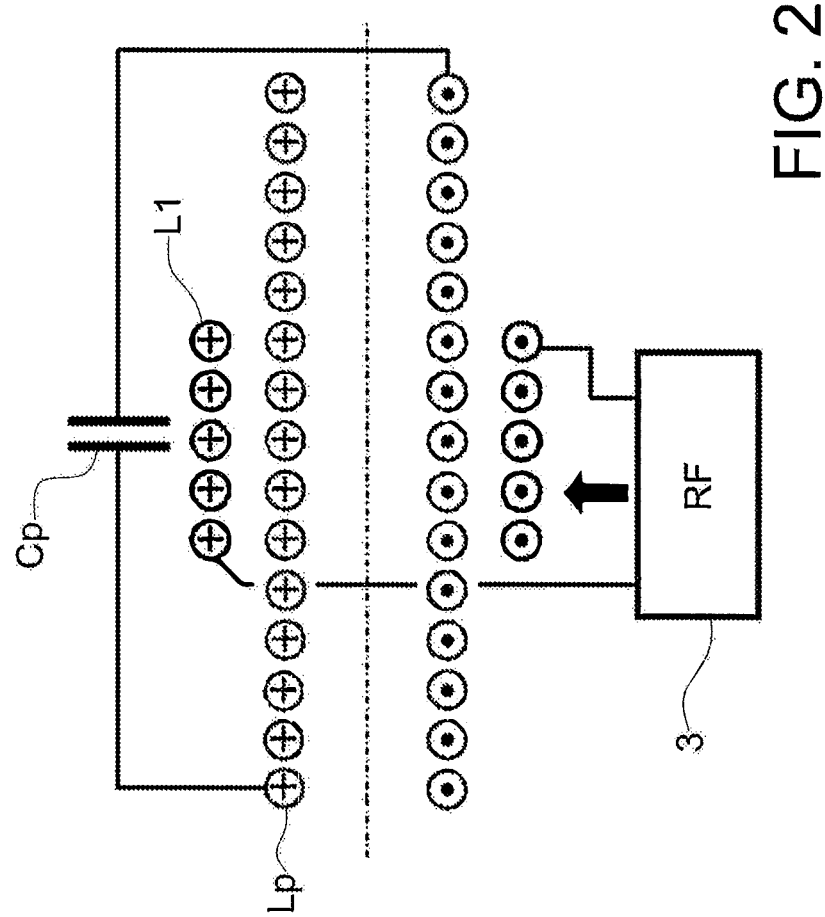

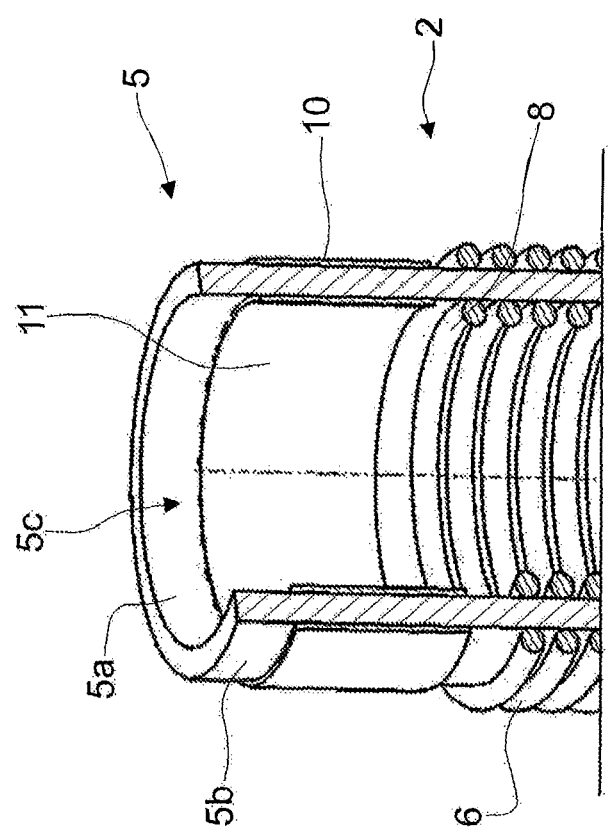

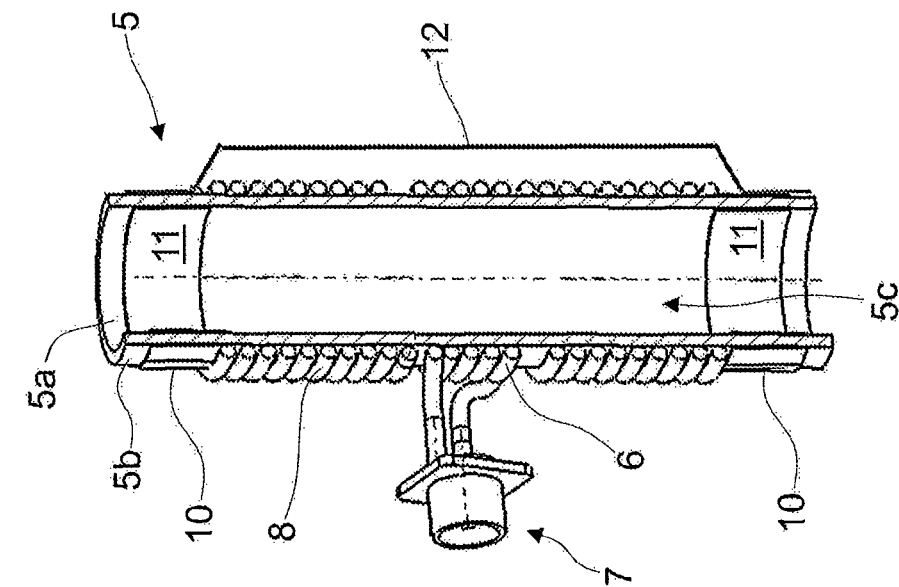
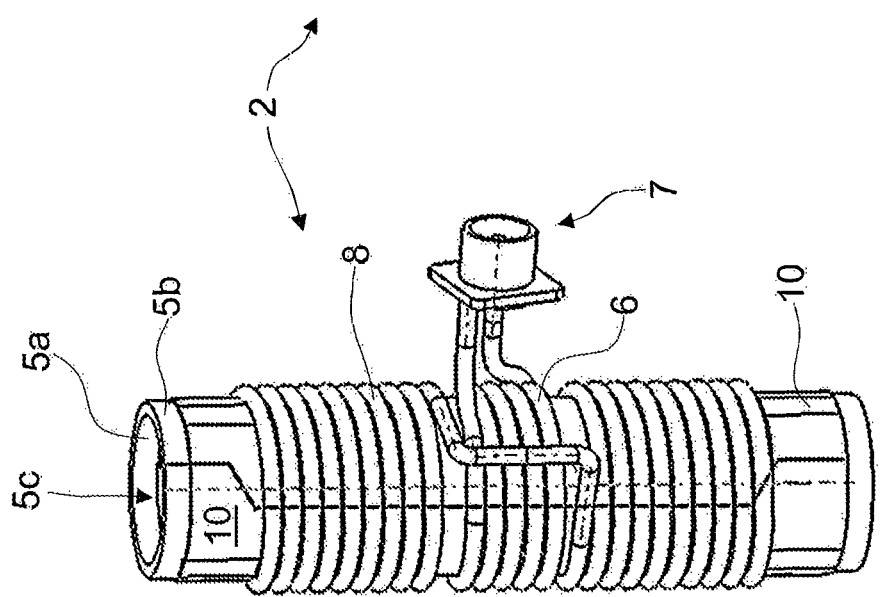
FIG. 5b
FIG. 5a

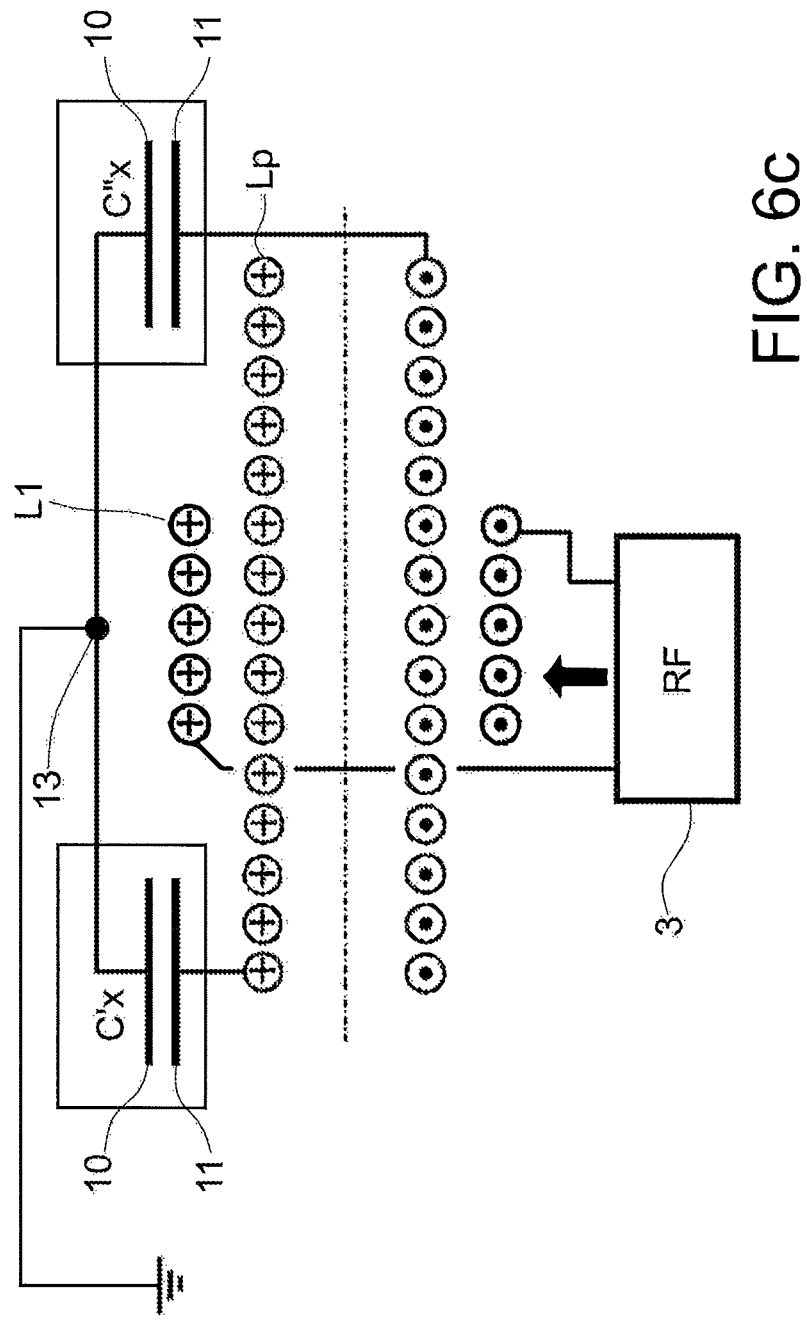

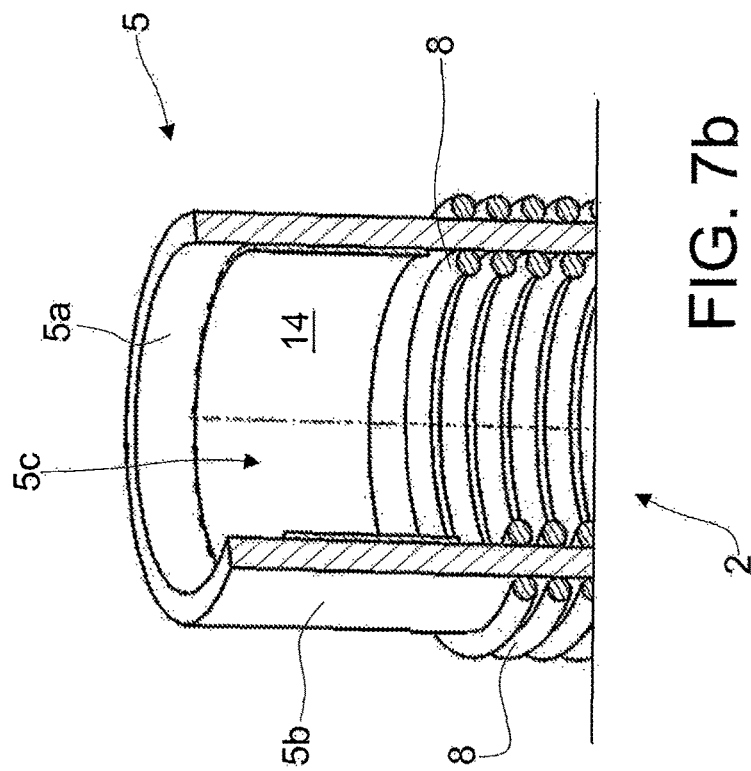
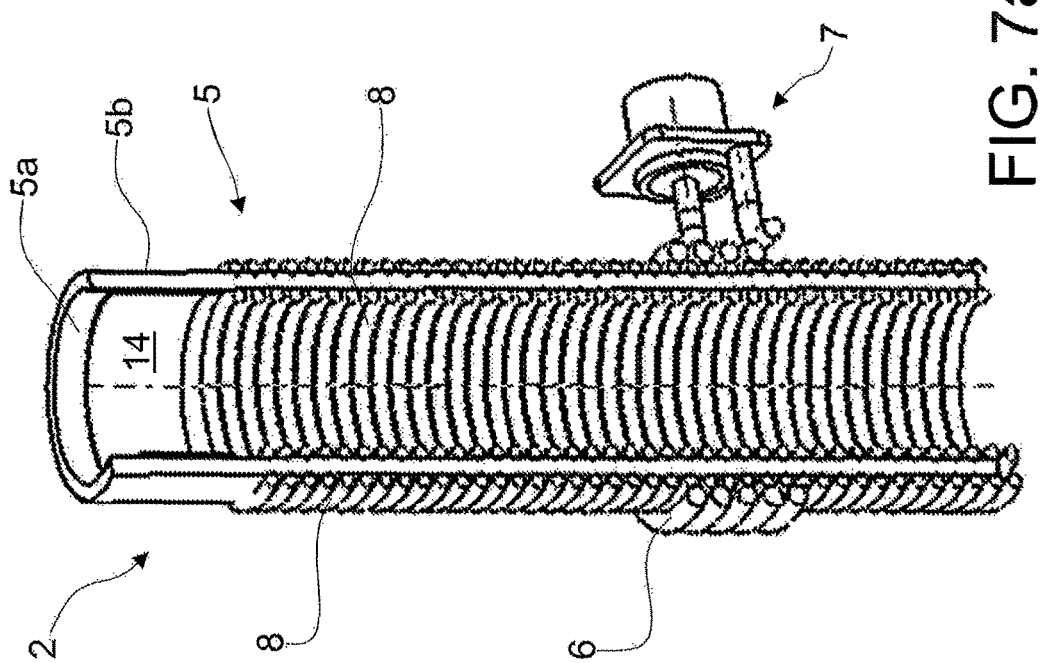

DEVICE INTRINSICALLY DESIGNED TO RESONATE, SUITABLE FOR RF POWER TRANSFER AS WELL AS GROUP INCLUDING SUCH DEVICE AND USABLE FOR THE PRODUCTION OF PLASMA

CROSS-REFERENCE TO RELATED APPLICATIONS

This application is a § 371 national stage entry of International Application No. PCT/IB2016/050199, filed Jan. 15, 2016, which claims priority to Italian Patent Application No. VR2015A000007, filed Jan. 16, 2015, the entire contents of which are incorporated herein by reference.

TECHNICAL FIELD OF THE INVENTION

The present invention regards a device intrinsically designed to resonate, suitable for the radiofrequency power transfer (in brief, RF) with materials of various nature. The present invention also regards a group comprising one such device, particularly usable in an apparatus for the production of plasma.

STATE OF THE PRIOR ART

Groups suitable for RF power transfer are known; these comprise a RF power supply with fixed or variable frequency, an adaptation element and a substantially inductive device.

The substantially inductive device of one such group has a load, not merely resistive, with impedance that is variable in modulus and phase with the variation of the frequency and the parameters of coupled power. With one such device and for the purpose of maximizing the power transfer, provision is made, in a conventional group, for the use, between RF power supply and substantially inductive device, of an adaptation element comprising suitable additional variable reactive elements, for example a matching-box, with the function of adapting the overall load at the terminals of the RF power supply. The matching-box can comprise both capacitive elements and inductive elements.

In such conventional systems, the maximization of the power transfer is obtained at the resonance frequency of the system composed of substantially inductive device and adaptation element (additional reactive elements—matching-box).

Such solution however has several problems.

First of all, in the conventional groups, the load compensated by the matching-box has an inductive component with extremely low modulus with respect to the standard output impedance (50-75 Ohm) of conventional RF power supplies, such to be comparable, at the work frequencies, to the parasitic elements (parasitic impedance) of the RF power supply circuit and of the matching-box. This implies that the power transferred by the RF power supply is divided between the substantially inductive device and the parasitic elements of the circuit, with dissipation of a significant part thereof in such parasitic elements.

In addition, in the conventional groups, the power supply current has a high value with respect to the voltage, such that the ohmic losses of the group are significant.

The substantially inductive device, if directly power supplied by the RF power supply, without the interposition of the adaptation matching-box, has an imaginary component of the equivalent impedance that is non-negligible, reflecting a significant fraction of the power transmitted to the RF power supply. For such reason, in the conventional groups, RF power supplies are required which are capable of supporting significant reflected power fractions when they operate in conditions of imperfect resonance.

Such conventional systems are also negatively affected by the limit of being power supplied only from RF sine wave power supplies. There is therefore the need to arrange devices suitable for power transfer which allow a RF power transfer that is more efficient with respect to the conventional devices.

U.S. Pat. No. 6,291,938B1, US20040124779A1, US20130088146A1, US20040263412A1 teach solutions according to the state of the art that use variable and fixed capacitances arranged according to the scheme of a matching box or matching network.

OBJECTS OF THE INVENTION

Therefore, the main object of the present invention is to improve the state of the art of the devices for the RF power transfer to materials of various type, particularly suitable for the production of plasma.

Another object of the present invention is to provide an alternative device with respect to the conventional devices.

A further object of the present invention is to provide a RF power transfer device which solves the drawbacks of the conventional devices.

Still another object of the present invention is to provide a RF power transfer device which is easy to manufacture and with competitive production costs.

Still another object of the present invention is to provide a group for the RF power transfer which can be powered by RF power supplies, not necessarily sine wave.

Not least object of the present invention is to provide a group for the RF power transfer which optimizes the produced power transfer.

According to one aspect of the present invention, a device is provided that is intrinsically designed to resonate, suitable for RF power transfer according to claim 1.

According to a further aspect of the present invention, a group is provided for the RF power transfer, according to claim 24.

According to a third aspect of the present invention, a method is provided for operating such group according to claim 28.

According to a fourth aspect, an apparatus is provided that is comprising such group for the power transfer, according to claim 32.

The dependent claims refer to preferred and advantageous embodiments of the invention.

BRIEF DESCRIPTION OF THE DRAWINGS

Further characteristics and advantages of the present invention will be clearer from the detailed description of a preferred but not exclusive embodiment of a device for the RF power transfer with materials of various type, given as a non-limiting example, in the enclosed drawings tables in which:

FIG. 1*a* is a schematic representation of a group comprising a device suitable for RF power transfer according to a first embodiment of the present invention;

FIGS. 2a, 2b and 2c respectively illustrate a longitudinal section view, a perspective view and a circuit diagram of a first variant of the device suitable for RF power transfer according to the second embodiment of the present invention;

FIGS. 3a, 3b, 3c and 3d respectively show a perspective view, a longitudinal section view, a view of a detail in enlarged scale and a circuit diagram of a second variant of the power transfer device according to the second embodiment of the present invention;

FIGS. 5a, 5b and 5c respectively illustrate a perspective view, a longitudinal section view and a circuit diagram of a third variant of the power transfer device according to the second embodiment of the present invention;

FIGS. 6a, 6b and 6c are respectively a perspective view, a longitudinal section view and a circuit diagram of the third variant pursuant to FIGS. 5a, 5b and 5c, illustrating several optional characteristics of the power transfer device according to the present invention;

FIGS. 7a, 7b and 7c respectively illustrate a longitudinal section view, a perspective view, and a circuit diagram of a fourth variant of the power transfer device according to the second embodiment of the present invention;

EMBODIMENTS OF THE INVENTION

Firstly, the idea underlying the power transfer device according to the present invention is that making a circuit function at resonance state signifies operating in the best possible energy transfer conditions.

Contrary to the conventional methods, mentioned briefly above, which provide for "forcing" a substantially inductive device and impedance adaptor means (matching-box) to work at a pre-established resonance frequency, the power transfer device according to the present invention is provided for working at the value of the frequency for which, during use, it freely resonates.

This is because perfect resonance allows obtaining high electromagnetic fields confined within the power transfer device or in proximity thereto, ensuring a high radio frequency power transfer to a load contained therein, e.g. a gas.

In the present description and in the following claims, with the term "capacitive element" it is intended both an electrical component or a plurality of electrical components which overall have an electronic behavior under voltage and current similar to the behavior of a capacitor, as well as a capacitive effect, usually undesired, developed in certain circumstances by one or more electrical components. Therefore, the term "capacitive element" refers to both electrical components or combinations thereof and parasitic capacitances.

Analogously, in the present description and in the following claims, with the term "inductive element" it is intended both an electrical component or a plurality of electrical components which, overall, have an electronic behavior under voltage and current similar to the behavior of an inductor, and an inductive effect, usually undesired, developed in certain circumstances by one or more electrical components. Therefore, the term "inductive element" refers to both electrical components or combinations thereof, and parasitic inductances.

Figure 1B:
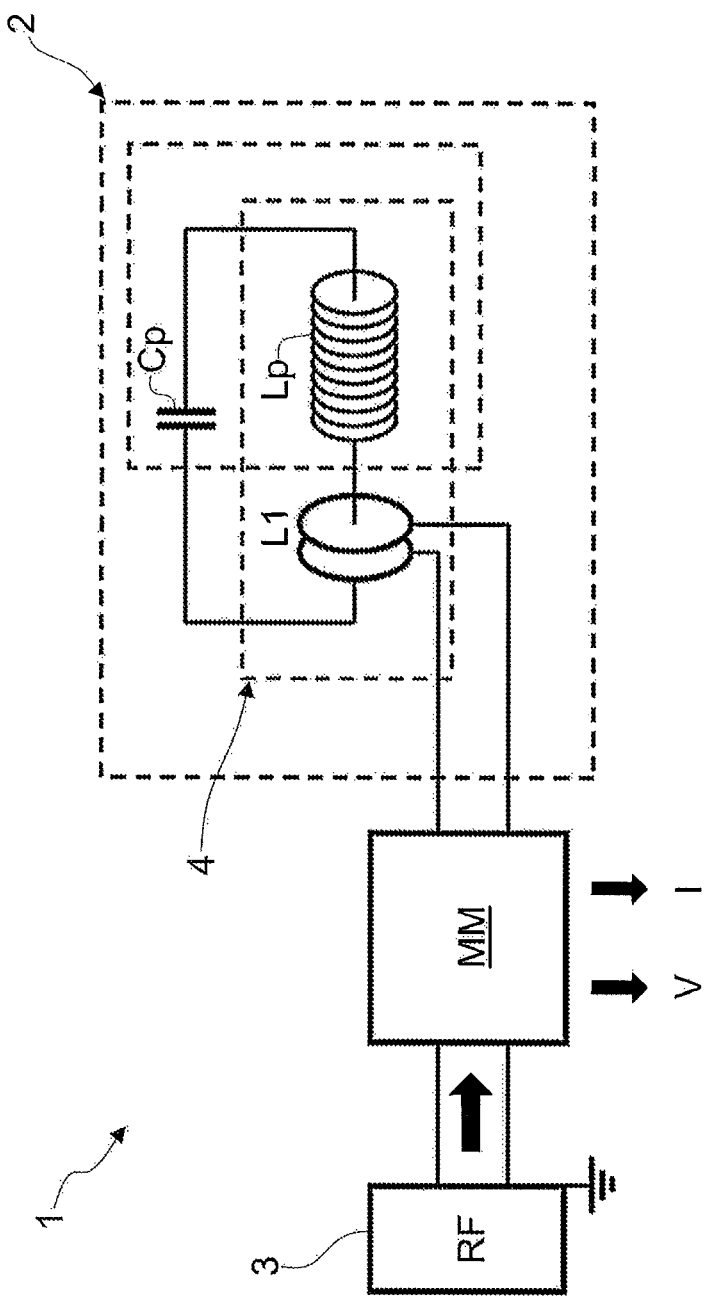
FIG. 1*b* shows a schematic representation of a group comprising a device suitable for RF power transfer according to a second embodiment of the present invention.

With reference now to FIGS. 1a and 1b, it will be observed that they schematically illustrate two preferred embodiments of a group comprising a device suitable for RF power transfer according to the present invention. In such figures, the group for the RF power transfer according to the present invention is generally indicated with the reference number 1 and comprises a power transfer device 2 of LC type, in technical jargon also termed "antenna", and a RF power supply means, indicated with the reference number 3 and set to power supply the device 2 at fixed or variable frequency. As will be better understood hereinbelow, one such device 2 for the transfer of power is intrinsically designed to resonate.

The group for the transfer of power, illustrated in FIGS. 1a and 1b, also optionally comprises measurement means MM, intended for vectorially measuring, during use, the voltage and the current at the terminals of the device 2 intrinsically designed to resonate and suitable for RF power transfer.

The device 2 that is intrinsically designed to resonate comprises an inductive element Lp and a capacitive element Cp, and is intended to work at resonance state, i.e. at an angular frequency equal to:

$$\omega o = \frac{1}{\sqrt{LpCp}}$$

The measurement means MM, in addition to measuring, as stated above, the voltages and the currents at the input of the device 2 intrinsically designed to resonate, are also arranged for verifying the possible phase displacement between such quantities so as to establish if, during use, the device works at resonance state or otherwise.

According to the first embodiment, illustrated in FIG. 1a, the device 2 intrinsically designed to resonate comprises a first inductive element Lp, specifically a coil, with a capacitance Cp placed in parallel thereto, and can be directly power supplied by the RF power supply 3 (i.e. without the interposition of other electrical components), at the terminals of the inductive element Lp.

In the second embodiment, however, reference is made to FIG. 1b, the device 2 intrinsically designed to resonate and suitable for RF power transfer comprises a transformer or autotransformer 4 which can be powered by means of the RF power supply 3.

Such transformer or autotransformer 4 circuit comprises, as seen in FIG. 1b, a primary circuit represented by a coil L1 having n1 turns, and a secondary circuit, represented by an inductive element Lp, specifically a coil having n2 turns, which is in turn electrically connected to a capacitive element Cp. In this second embodiment, the primary circuit is power supplied at the terminals of the coil L1.

In the device 2 intrinsically designed to resonate and suitable for RF power transfer according to the present invention, the impedance adaptation, necessary for obtaining an optimized power transfer, depends, among other things on the sizing of the device itself. Advantageously, in both embodiments of the present invention, the capacitive element (Cp) and the inductive element (L1, Lp) of the device 2 intrinsically designed to resonate have values such that (in technical jargon "they are sized in a manner such that") the equivalent impedance at the terminals of the RF power supply 3 is, at resonance state, nearly entirely resistive and much greater than the parasitic impedance of the circuit upstream of the device 2.

By way of reference, with the term 'much greater' it is intended from about 10 to 100 times more than the parasitic impedance of the circuit upstream of the device 2 according to the present invention.

Such high values of equivalent impedance of the device 2 intrinsically designed to resonate, and suitable for RF power transfer, render negligible the effect of the parasitic impedance of the RF power supply 3.

With regard to the inductive element Lp, this signifies working with inductances of high value, e.g. of value comprised between several hundred nH (e.g. 200 nH) and 10 µH or more, which allow obtaining a high merit factor Q and at the same time reduce the abovementioned drawbacks relative to non-negligible dissipative phenomena in the conventional systems. Likewise, with regard to the capacitive element Cp, this signifies working with capacitance of reduced value, e.g. comprised between several dozen pF and a hundred pF. Such condition (reduced capacitance) further facilitates a high value of the merit factor, increasing the efficiency of the resonant circuit.

With regard to the capacitive elements Cp, the device 2 according to the present invention provides for several variants, which will be better illustrated hereinbelow. Generally, such variants contribute to generating a mainly electric field, synchronous with the magnetic field generated by the inductive elements. This achieves an enhancement of the overall electromagnetic field emitted by the device, with consequent improvement of the efficiency of the energy transfer by the device 2 intrinsically designed to resonate to a load (e.g. a gas, a plasma or other material within the device 2 or in its immediate vicinity). Generally, the capacitive element Cp of the device 2 intrinsically designed to resonate and suitable for RF power transfer can be a capacitor physically separated from the inductive element Lp or integrated therein, or of so-called distributed type, or obtained by exploiting the parasitic capacitances of the inductive component itself.

Returning to the equivalent impedance modulus of the device 2 intrinsically designed to resonate, suitable for RF power transfer, the equivalent impedance of the device 2 at the terminals of the RF power supply 3 is determined not only by the size and physical-electrical characteristics of the inductive elements (L1, Lp), of capacitive elements (Cp) and of any other element possibly present in the resonant circuit, but also, in the second embodiment (FIG. 1b), by the ratio of the turns n1:n2 between the primary circuit and secondary circuit of the transformer 4.

In such second embodiment, in fact, a different turns ratio between primary and secondary circuit in practice only modifies the equivalent impedance modulus seen at the input terminals of the device 2, without significantly modifying the resonance frequency. This advantageously allows obtaining, among other things, a value equal to 50Ω or another value suitable for the output impedance of a RF power supply of commercial type or suitably made.

The interval of values of the equivalent impedance obtainable by suitably sizing the elements of the device 2 is generally comprised between 10 and 1000Ω and ensures the possibility to connect the device 2 also to non-conventional amplifiers RF, with equivalent output impedances, also very different from the conventional 50Ω-75Ω.

The man skilled in the art will observe that, with one such configuration, the power component reflected to the RF power supply is thus minimized. In addition, the high value of the equivalent impedance modulus, at resonance state, allows advantageously operating with high values of voltage and low values of current, thus minimizing the ohmic losses.

Figure 1C:
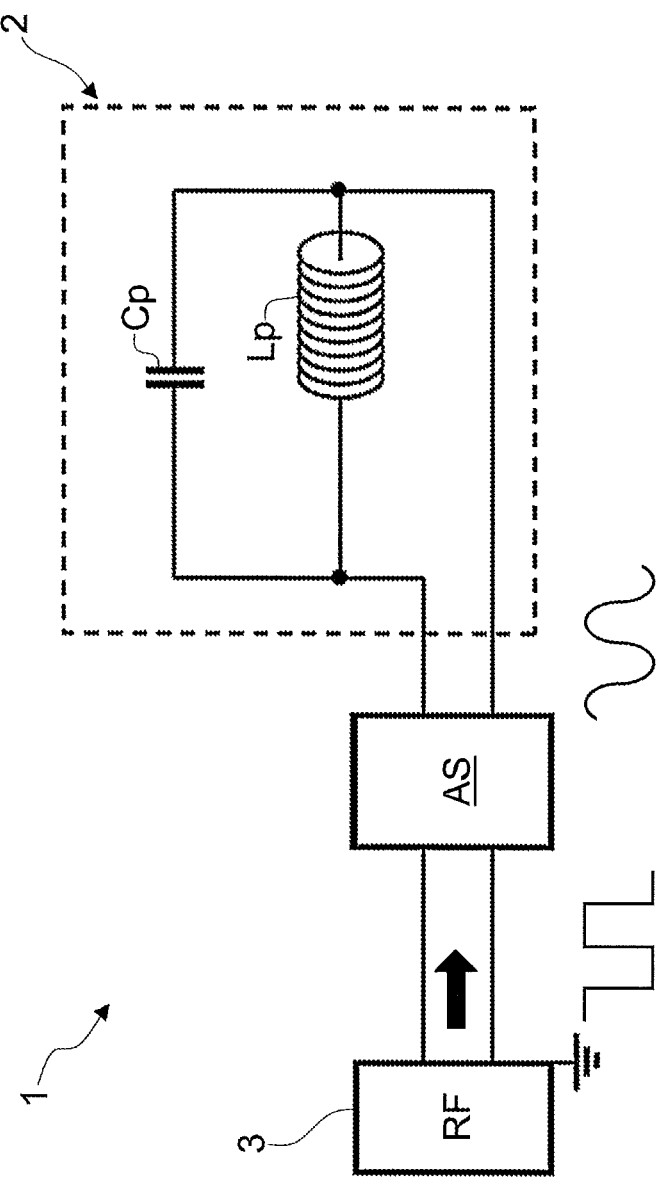
FIG. 1*c* illustrates a schematic representation of the group of FIG. 1*a*, provided with a signal adapter module.
Figure 3B:
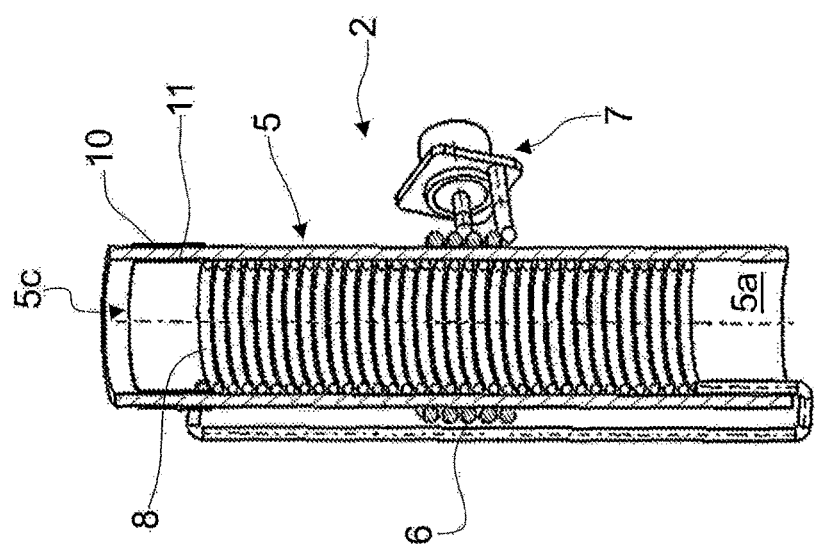
Figure 3A:
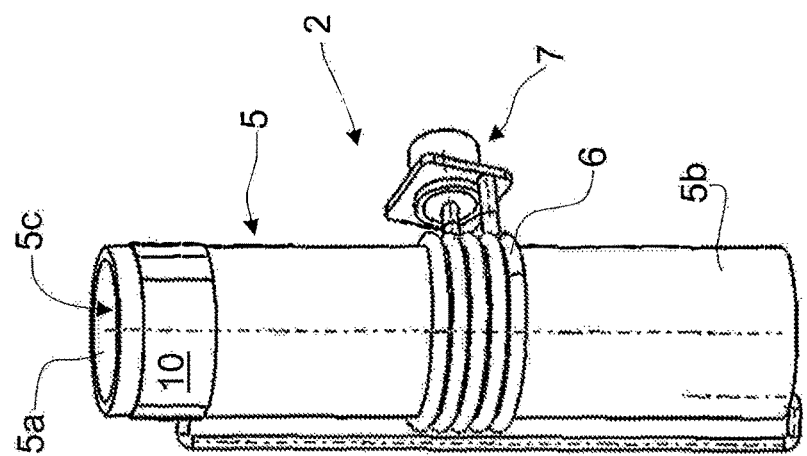
Figure 3D:
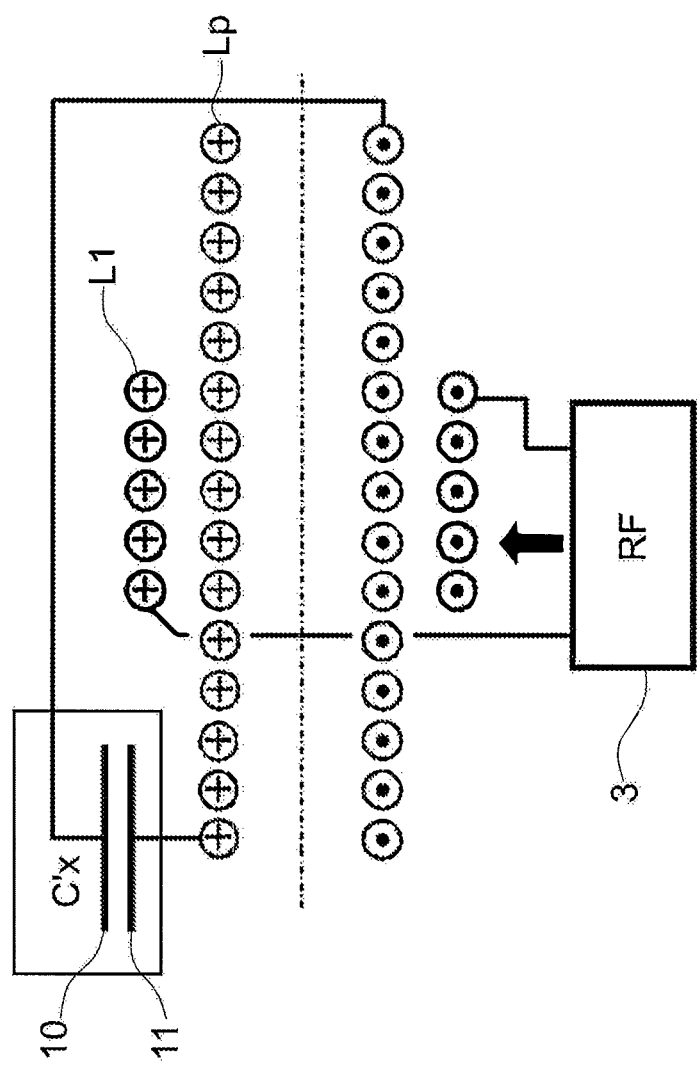

It should also be observed that with a configuration as described above, the device 2 intrinsically designed to resonate, suitable for RF power transfer according to the present invention—contrary to what occurs in the conventional systems—can be power supplied by a square wave switching RF generator, functioning at the actual resonance frequency of the device 2, if an adapter module is interposed between such device and the RF power supply. Such adapter module, indicated with reference AS in FIG. 1c, is typically a series resonant LC filter or analogous device only composed of passive elements. This offers numerous advantages, including among others the fact that, as is known the square wave power supply is generally much more efficient than a sine wave generator.

With regard to the device 2, hereinbelow and with reference to FIGS. 2a to 8c, several embodiment variants will be illustrated of the device 2 that is intrinsically designed to resonate, suitable for RF power transfer according to the present invention, with particular reference to the second embodiment, in which, therefore, the device 2 comprises a transformer or autotransformer 4.

In each case, the man skilled in the art will easily understand that such embodiment variants can be equally applied to the first embodiment of the present invention, i.e. in which the inductive element Lp of the device 2 is directly power supplied by the RF power supply 3, or in the absence of the primary circuit L1.

As will be seen, in the variants illustrated in such figures, provision is made for the presence of one or more electrodes or capacitances integrated in the structure of the device 2, which contribute to the formation of an axial and/or radial electric field, in addition to the magnetic field due to the inductive elements of the device 2. The effect of such capacitances is to increase the electric field component that can be generated. Such additional electric field, as will be clearly seen hereinbelow in the description, can also be obtained by suitably selecting the ratio between the number of turns of the secondary circuit Lp and of the primary circuit L1 (n2/n1), if the RF power supply has an output impedance of about 50-75Ω with low-average power (about 50-200 W), in a manner that such ratio is equal to or greater than 5, e.g. even over 20, such that the voltages at the terminals of the secondary circuit Lp are particularly high.

If, however, the RF power supply has high output voltages, for example in the case of RF power supplies with output impedance 50-75Ω and output power greater than 200-500 W or in the case of amplifiers with output impedances even different from the standards 50-75Ω, but with output voltages greater than 100-200 V, the ratio n2/n1 can be less than 5, even equal to 1.

Naturally, the required power level that can be supplied by the RF power supply depends on different factors such as, for example, the desired density of a plasma to be obtained, the volume in which such plasma is produced, a possible flow of gas, the gas type, etc.

Generally, given the same abovementioned parameters, the turns ratio must be greater the lower the voltage suppliable by the RF power supply.

With reference, in particular to FIGS. 2a to 2c, it will be observed that the device 2, intrinsically designed to resonate and suitable for RF power transfer according to the present invention, comprises a support structure 5 made of electrically insulating material, illustrated in the figures enclosed with the present description with tubular configuration, with internal surface 5a and external surface 5b and internally delimiting a work area 5c.

The support structure 5, nevertheless, can have any configuration so long as it allows, as will be seen hereinbelow, supporting the other components of the device 2 and maintaining them physically separated from each other; the support structure 5 delimits a work area or region 5c, which during use is affected by the electromagnetic field transferred by the device 2. One such support structure 5 can for example comprise a plurality of elongated plate-like elements, preferably 3 or more, arranged substantially parallel and angularly offset from each other around a same longitudinal axis and set to support the components of the device 2. Such plate-like elements delimit a work area 5c and each has an external surface 5b, opposite an internal surface 5a directed towards such work area 5c.

Preferably, the support structure is made of electrically insulating material, e.g. quartz. The device 2 intrinsically designed to resonate and suitable for RF power transfer according to the present invention comprises a first winding 6, arranged longitudinally around such support structure 5 (tubular in the figure) and in contact with the external surface 5b thereof. Such first winding 6 forms part of the primary circuit of the transformer 4 pursuant to FIG. 1b and corresponds, in the electric diagram of FIG. 2c, to the coil L1. The device 2 intrinsically set to resonate comprises means 7 for the electrical connection with a RF power supply 3, at the ends of the first winding 6.

The device 2 according to the present invention also comprises a second winding 8, arranged coaxially and inside the support structure 5, in contact with the internal surface 5a of the structure itself. Such second winding 8 corresponds, in the electrical scheme of FIG. 2c, to the coil Lp of the secondary circuit of the transformer 4.

According to a first variant of the device 2 intrinsically designed to resonate and suitable for RF power transfer according to the second embodiment of the present invention, the capacitive element Cp of the device 2 is given by an external capacitor 9, electrically connected, as is seen in the figures, at the terminals of the second winding 8. In such case, the rheophores of the external capacitor 9 are connected, preferably directly welded, i.e. without interposition of further electrical components, at the terminals of the inductive element, e.g. of the second winding 8, so as to ensure the minimum possible value of the three parasitic quantities, the R (short wire), the L (dispersed inductance that does not generate magnetic field) and the C. Hence, the rheophores advantageously have section of several mm$^2$, e.g. about 10-20 mm$^2$ with length less than or equal to about 10-15 cm.

With one such configuration it is easy to understand that within the support structure 5, in the work area 5c delimited thereby, a RF electromagnetic field is generated during use.

With reference now to FIGS. 3a to 3d, it will be observed that the device 2 intrinsically designed to resonate, suitable for RF power transfer according to the present invention, substantially comprises the same structure of the device illustrated in FIGS. 2a to 2c, with the (second) variant that, in this case, the capacitive element Cp of the device 2 is integrated in the support structure 5, or obtained by means of a pair of laminar elements made of electrically conductive material, for example a pair of copper sheets 10 and 11, applied to the support structure 5, at one end thereof, one inside and one outside the same. Such elements constitute the two armatures of a capacitor C'x with dielectric interposed, illustrated in FIG. 3d.

The man skilled in the art will easily understand that, in this case, the support structure 5 could be made, in an entirely equivalent manner, for example by means of:

a plurality of elongated plate-like elements arranged parallel and angularly offset around a longitudinal axis, and a tubular element, with circular section for example, connected to one end thereof, at which the copper sheets 10 and 11 made of electrically conductive material are applied. Also in this case, the capacitor C'x is connected at the terminals of the coil 5 Lp of the secondary circuit of the transformer 4, which in the figures corresponds to the second winding 8.

Figure 4A:
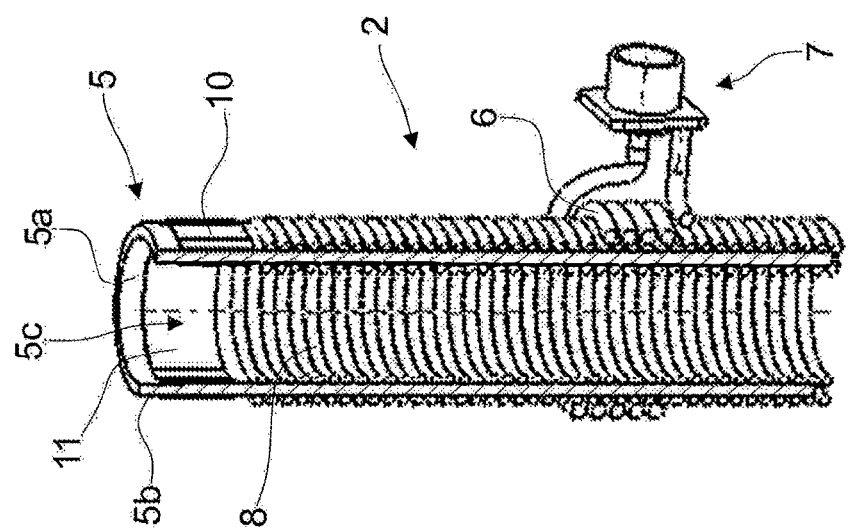
FIGS. 4a, 4b and 4c respectively are a perspective view, a longitudinal section view and a circuit diagram of the second variant pursuant to FIGS. 3a, 3b, 3c and 3d, provided with several optional characteristics according to the present invention.
Figure 4B:
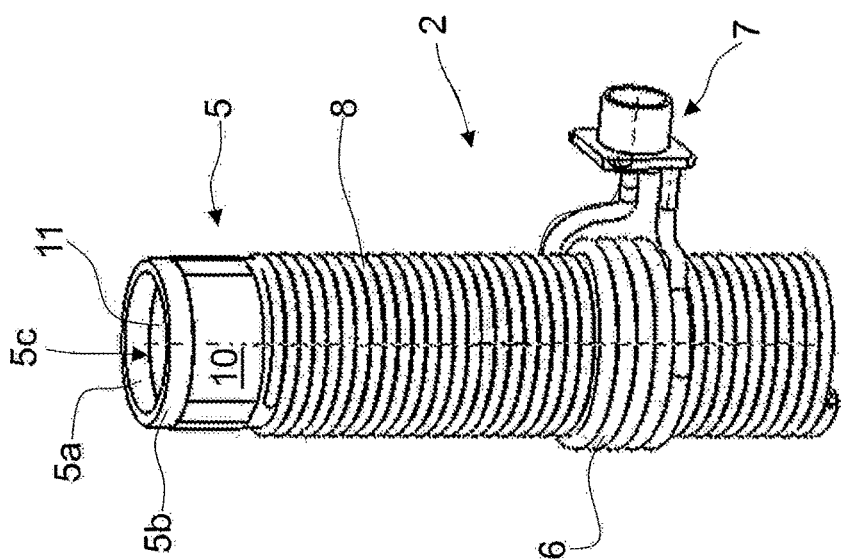
Figure 4C:
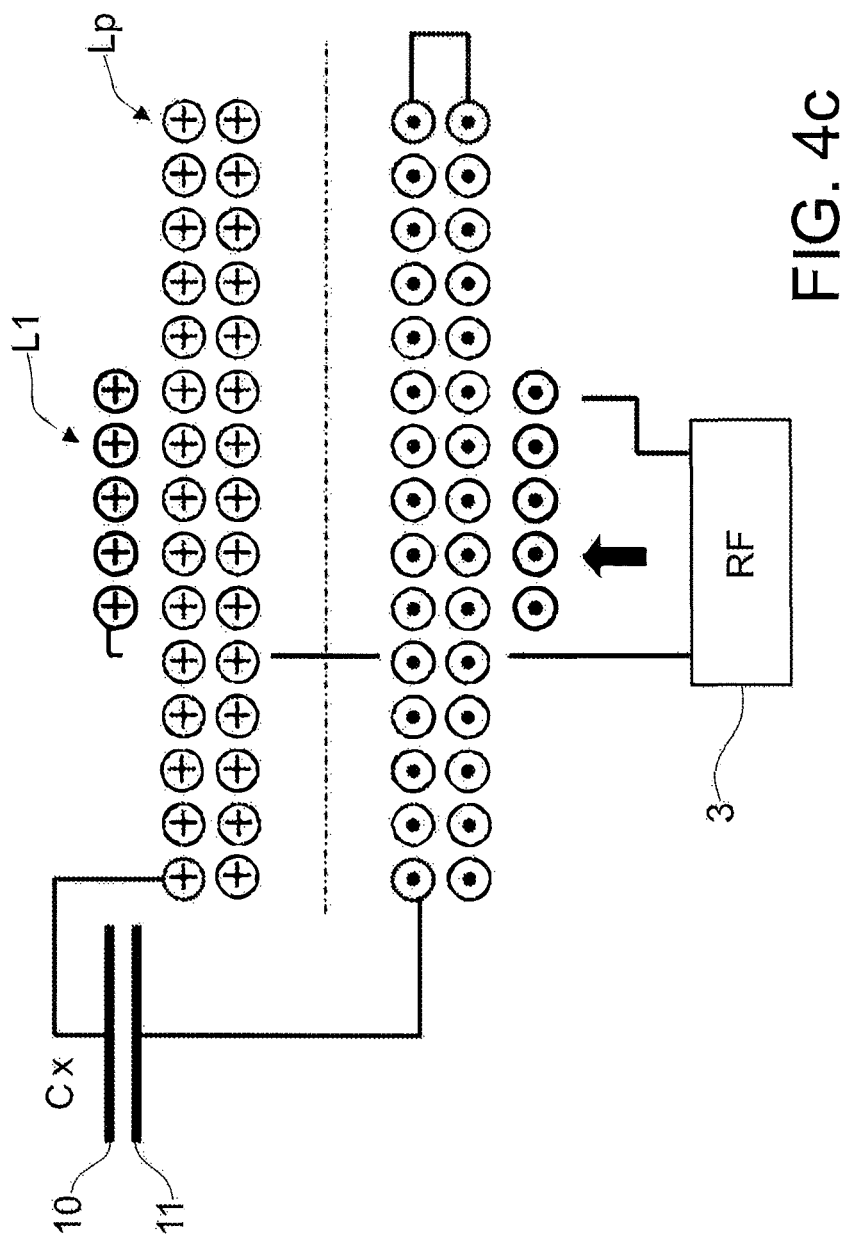

In FIGS. 4a to 4c, a device 2 is illustrated that is intrinsically designed to resonate, suitable for RF power transfer entirely equivalent to that illustrated in FIGS. 3a to 3d, in which nevertheless the secondary circuit of the transformer 4 comprises a coil Lp with double layer. In the embodiment of FIGS. 4a and 4b, such coil corresponds to the second winding 8 and comprises two layers arranged on opposite sides with respect to the support structure 5 of the device.

Figure 5C:
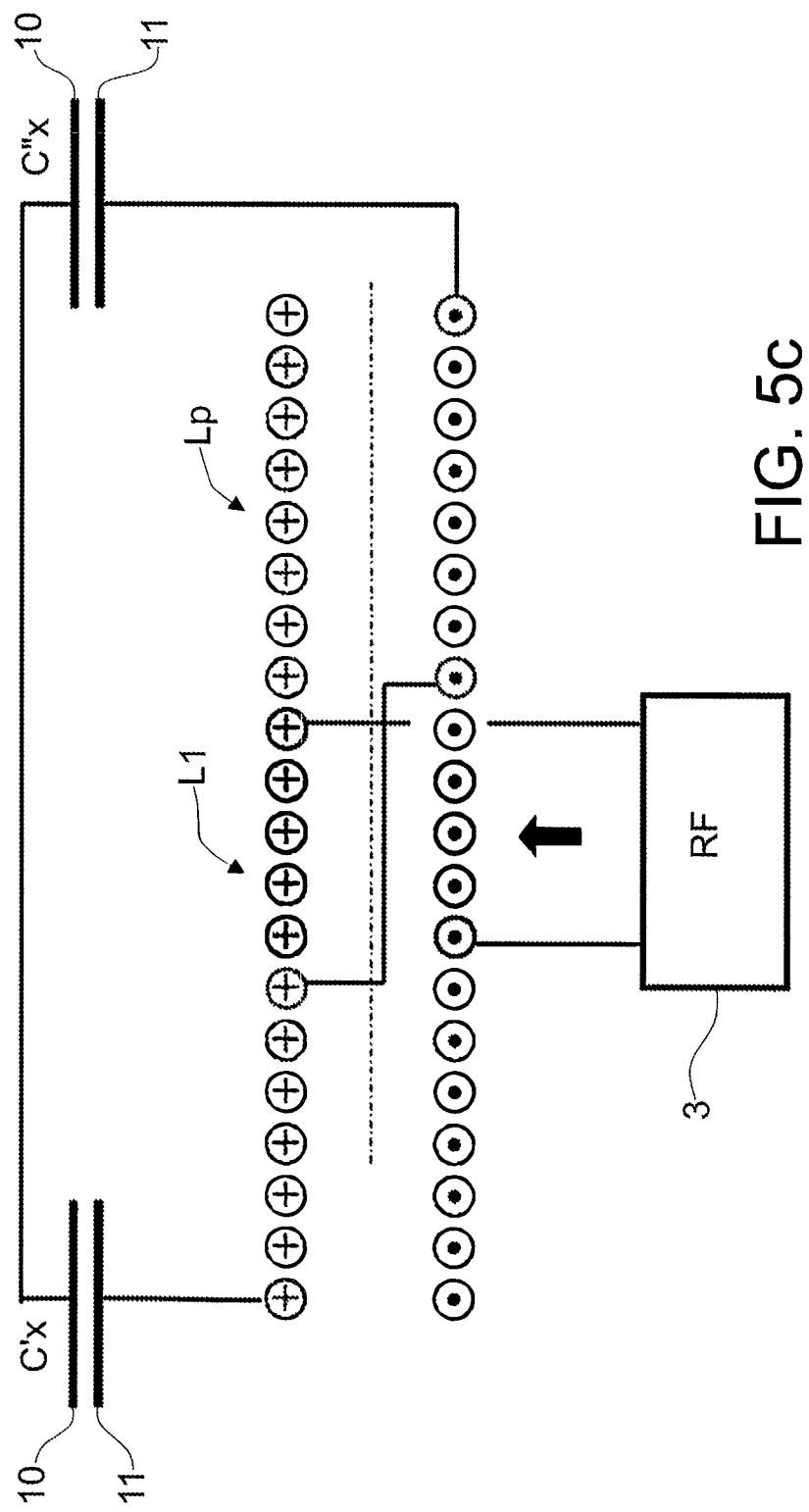

A third variant of the device 2 intrinsically designed to resonate, suitable for RF power transfer, according to the second embodiment of the present invention is illustrated in FIGS. 5a to 5c.

In this case, both the first winding 6 and the second winding 8 are externally wound on the support structure 5 made of insulating dielectric material. The capacitive element Cp of the device 2 is in fact integrated in the structure 5 and obtained by means of two pairs of elements of electrically conductive material, e.g. like those described with reference to FIGS. 3a to 3d, the laminar elements of each pair being as follows: one applied inside and the other applied outside the support structure 5. Each pair is applied at one end of such support structure 5. As seen in FIG. 5b, the pairs of elements of electrically conductive material are electrically connected to each other in series by means of a connection element 12 made of electrically conductive material. At any rate, nothing prohibits providing for a plurality of such connection elements 12 for the connection in series of the pairs of elements made of electrically conductive material, e.g. arranged angularly offset from each other around the support structure 5.

Such elements constitute the armatures of two capacitors C'x with dielectric interposed and electrically connected in series at the terminals of the second winding 8 (Lp in FIG. 5c).

From the attainment standpoint, the man skilled in the art will easily understand that the conductive element Cp of the device 2 intrinsically designed to resonate, suitable for RF power transfer, can be obtained with only one capacitance or with multiple capacitances connected to each other in series and/or in parallel. The elements made of conductive material applied to the support structure 5 may possibly be longitudinally cut in order to avoid creating short-circuit turns.

Figure 6B:
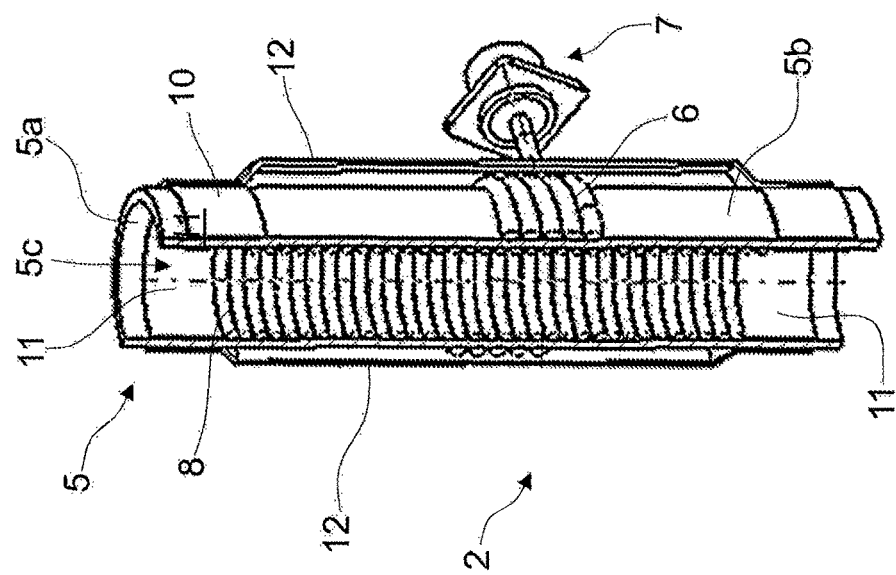
Figure 6A:
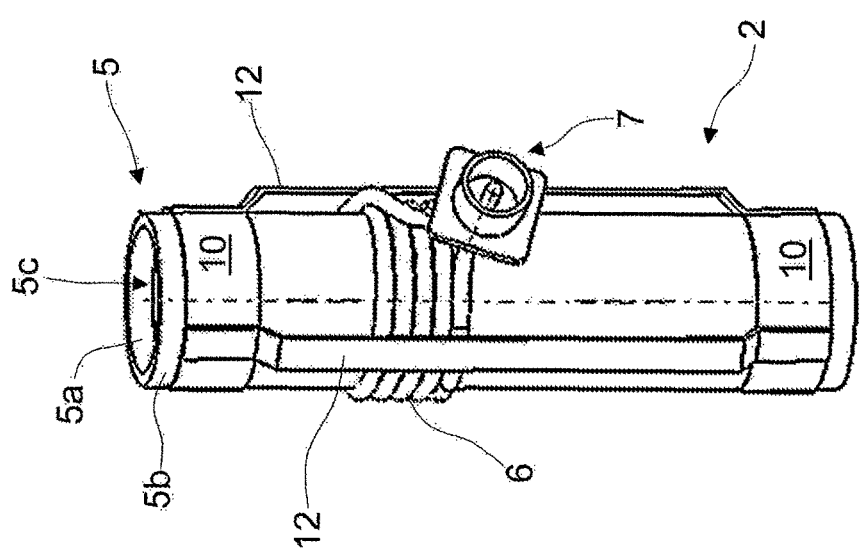

According to an alternative and optional configuration of the above-described third variant, illustrated in FIGS. 6a to 6c, the second winding 8 can be provided inside the support structure 5 and in addition, as will be explained hereinbelow, in this case a ground connection 13 is provided between the two capacitors in series C'x, in order to obtain a balancing of the voltage on the secondary circuit.

According to a fourth variant of the second embodiment (FIGS. 7a to 7c), the device 2 intrinsically designed to resonate, suitable for RF power transfer comprises a second winding 8 with double layer and the capacitive element Cp of the device 2 is given by the parasitic capacitances developed therein. Such parasitic capacitances are indicated with the reference Cx in FIG. 7c. In this case, the support structure 5 can only comprise a plurality of plate-like elongated elements, angularly offset from each other around a longitudinal axis and placed between the winding 6 of the primary circuit and the winding 8 of the secondary circuit, in a manner so as to keep the windings spaced from each other.

Figure 7C:
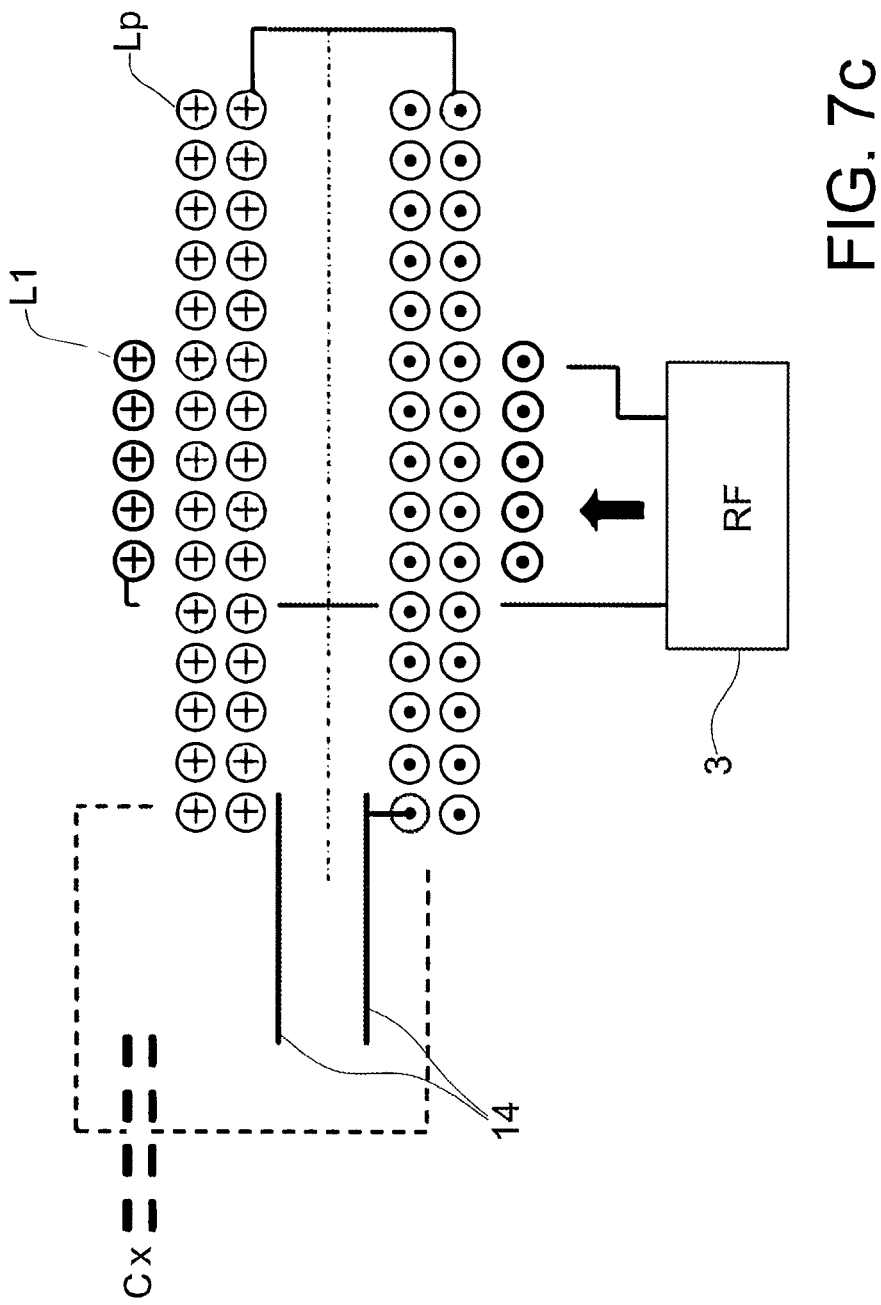

Still in such fourth variant, a laminar electrode 14 is illustrated that is provided on the internal surface 5a of the support structure 5, at one end thereof and electrically connected to the second winding 8 (see in particular FIG. 7c). Such laminar electrode 14 has the function of increasing the axial and/or radial electric field in the immediate vicinity of the device itself, and can be powered to a synchronous electric potential, possibly offset with respect to the supply voltage of the power transfer group.

Figure 8B:
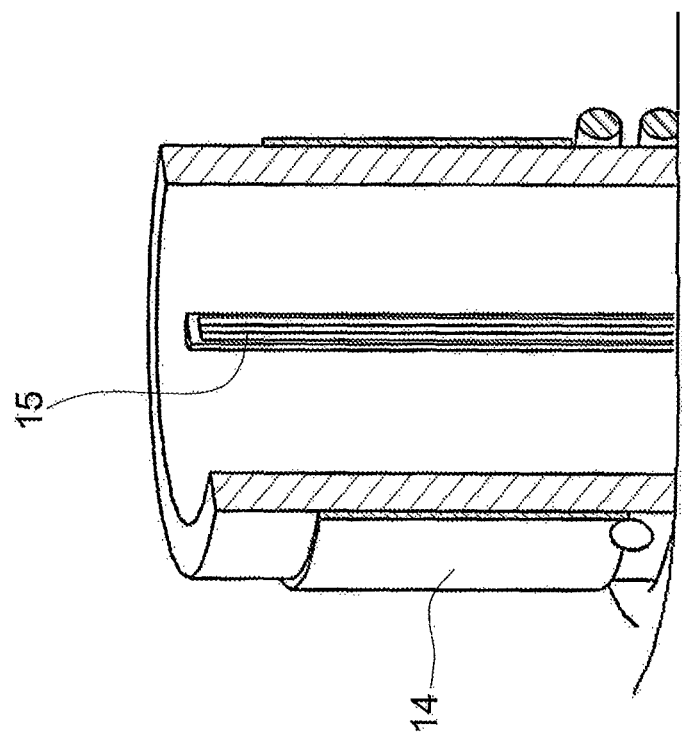
FIGS. 8a, 8b and 8c respectively show a longitudinal section view, a view of a detail in enlarged scale of FIG. 8a, and a circuit diagram of a fifth variant of the power transfer device according to the second embodiment of the present invention.
Figure 8A:
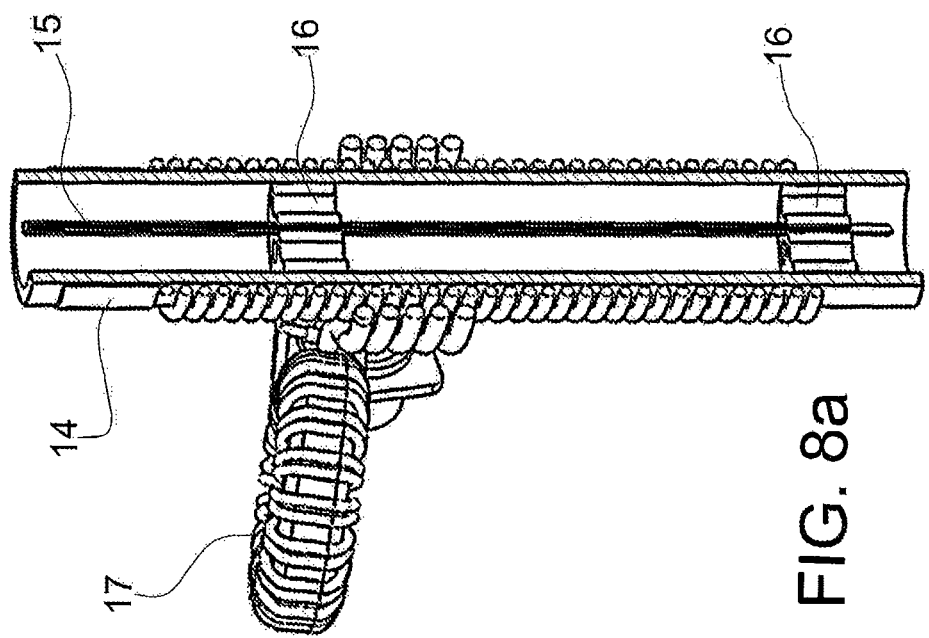
Figure 8C:
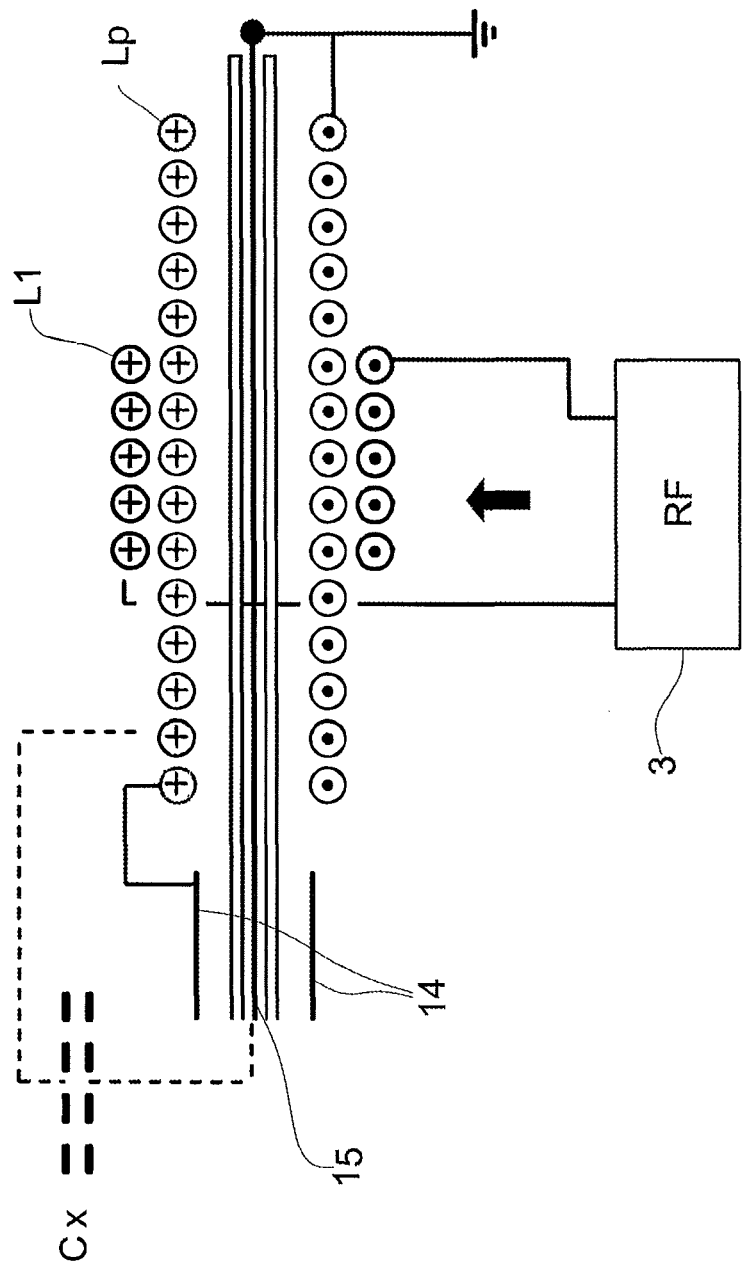

In FIGS. 8a to 8c, further variants of the power transfer group 2 are described. In this case, the device 2 intrinsically designed to resonate, suitable for RF power transfer, comprises a laminar electrode 14 of the type described with reference to FIGS. 7a to 7c but applied to the exterior of the support structure 5, always electrically connected to the second winding 8. The device 2 intrinsically designed to resonate, suitable for RF power transfer, can also comprise a further wire-like electrode 15, arranged inside a rod-like tubular means made of insulating material, axially supported in the support structure 5, by means of suitable support means 16. Also this wire-like electrode 15 contributes, during use, to forming an additional electric field in the device.

In FIG. 8a, an additional external transformer 17 is also illustrated, a voltage elevator applicable to the device 2 in order to obtain an improved coupling with regard to the RF power supply. Such additional transformer can be obtained with the two-wire technique of the "balun" 1:n or other equivalent techniques used for transformers or autotransformers RF.

The man skilled in the art will understand that such above-described variants of the device 2 intrinsically designed to resonate, suitable for RF power transfer, can be implemented in combination with each other, in order to obtain a desired configuration of the device 2 itself.

The man skilled in the art will also understand that, if a balanced transformer of "balun" type is used as impedance adapter, the winding of the primary circuit 6 is power supplied by a voltage that is balanced with respect to the ground, hence the average value of the voltage distributed on the primary circuit is zero. Consequently, also the average value of the voltage distributed on the secondary circuit 8, due to the capacitive effect with the primary circuit, is zero. In such situation, if as capacitive elements of the device intrinsically designed to resonate 2, suitable for RF power transfer, two capacitors in series C'x are used, equivalent to each other, whether external (as suggested in FIG. 2a) or integrated (as illustrated for example in FIG. 6a), given that they achieve a capacitive divider of the potential difference at the terminals of the coil of the secondary circuit, the point of electrical connection therebetween is at zero potential, at each instant. Such point can then be connected to the ground of the device. In addition, in the case of integrated capacitors C'x as in FIGS. 6a to 6c, i.e. coaxial with respect to the support structure 5, the external armatures 10 are spontaneously situated at zero potential, hence they can be electrically connected together by means of the connection means 12, and to the ground of the system (13) together with an external screening (optional) that completely winds around the antenna.

The man skilled in the art will also understand that other variants are possible beyond those described above.

For example, it is possible to obtain the primary circuit of the transformer 4 with a plurality of wire-like conductors, placed in parallel, each electrically insulated from the others, in order to minimize the drawbacks tied to the skin effect of the circuit in RF.

It is possible to make the secondary circuit with multiple conductors side-by-side each other, in order to better exploit the skin effect.

It is also possible to make both the primary circuit and the secondary circuit in two or more sections longitudinally side-by-side each other. The electrodes 14 and 15 can be independently power supplied or electrically connected to the resonant group LpCp.

The possibility to make the secondary circuit with a single layer or multilayer has already been described above, as has the possibility to make the impedance adapter transformer according to different techniques, with balanced output or imbalanced output.

With particular reference to the above-described windings, these can be obtained with a copper conductor (or a conductor made of any other suitable conductive material) with circular section or rectangular section or polygonal section or multi-wire (e.g. of Litz type), or a tubular conductor (for allowing the circulation of possible coolant fluid). For the windings, both primary and secondary, it is possible to use a conductor with circular section, rectangular (the conventional plate), with polygonal section or the wire of Litz type. The conductor with circular section, most commonly used, is easily windable and allows obtaining a high ratio of turns number over length unit, with consequent high value of the obtainable inductance. With the conductor with rectangular section, given the same section with respect to the circular section, there is a lower ratio of the turns number over length unit, with a consequent lower value of the equivalent inductance; hence, the condition relative to the skin effect is improved. Comparing the two solutions (circular section or plate), it is known that the plate allows obtaining, given the same length of the winding, a lower inductance with a consequent greater resonance frequency, but this is acceptable since the plate section better exploits the skin effect, which is more evident as the frequency increases. A kind of self-compensation occurs of the frequency behavior, passing from the wire with circular section to the plate. The advantage of the Linz wire is in the bulk comparable with a wire with circular section, but with a behavior due to skin effect comparable if not even better than the plate. While the rigid wire with round cross section can be self-sustaining, the Linz wire, being non-rigid, requires an insulating material support.

At any rate, the man skilled in the art will easily understand that in work conditions with reduced frequency, e.g. comprised between several hundred KHz and several Hz, a greater inductance is required for the coil Lp of the secondary circuit, with a greater number of turns, but the skin effect, less strong, allows using a conductor with circular section. In work conditions with high frequency, for example comprised between several MHz and several tens of MHz, a lower inductance is required of the coil of the secondary circuit 8, with a smaller number of turns, and given the stronger skin effect, it is preferably to use a winding with rectangular section (polygonal).

The above-described device 2 intrinsically designed to resonate, suitable for the RF power transfer, allows obtaining during use, in the region 5c delimited by the support structure 5 or in proximity thereto, electromagnetic fields of high intensity, which are thus particularly suitable for the production of plasma, or for other applications that require the RF power transfer to solid, liquid or gaseous materials.

Figure 9:
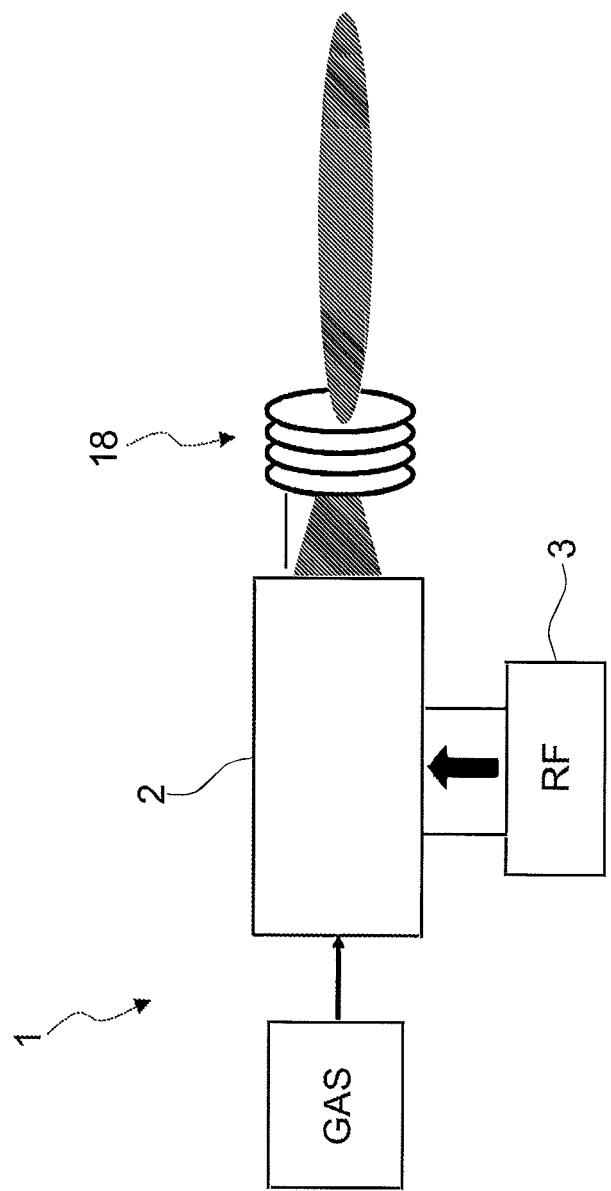
FIG. 9 is a schematic representation of an apparatus comprising a device for the power transfer according to the invention, suitable for the production of plasma.

For such purpose, schematically illustrated in FIG. 9 is an apparatus suitable for the production of plasma starting from a gaseous source and employing the device 2 according to the present invention.

As seen, one such apparatus provides for supply means for a material, e.g. gas, in input to a device 2 intrinsically designed to resonate and suitable for power transfer as described above, i.e. at one end of its support structure 5. The apparatus also comprises a RF power supply with variable or fixed frequency, intended during use to power supply the device 2, as well as plasma focusing means 18 at the output of the device 2, i.e. at the other end of the support structure 5 of the device. Such focusing means 18 comprise one or more coils power supplied in direct current, provided for increasing the efficiency of the device for the production of plasma.

The device 2 of such apparatus, as it appears from the above-provided detailed description, is therefore obtained from the circuitry standpoint according to a LC configuration with an additional impedance Z corresponding to the load (substantially of resistive type) applied thereto, i.e. a gas or another material in the work area 5c of the device 2 itself or in proximity thereto. Such apparatus, as clearly appears, does not necessarily require adapter elements of the impedance outside the device 2, intrinsically designed to resonate as described above RF, in order to obtain the operation at a specific resonance frequency.

The apparatus functions at the actual resonance frequency of the device 2 intrinsically designed to resonate and not, as already stated above, at the resonance frequency of the system composed of a substantially inductive element and of the relative impedance adapter circuit, typical of the conventional systems. The electrical efficiency of the energy transfer of the apparatus is therefore high, with consequent high power transferred to the load (plasma or to another material type).

The man skilled in the art will easily understand that the device 2 intrinsically designed to resonate, suitable for RF power transfer, does not require the use of a ferromagnetic core at the inductive elements (L1, Lp). Nevertheless, nothing prohibits inserting a ferromagnetic core as additional element of the resonant circuit for applications which, in accordance with the case, would benefit therefrom.

As stated above, at resonance state, the equivalent impedance seen by the RF power supply 3 is of resistive type and this, together with the fact of employing advantageously high impedances implies a series of advantages, including:

the fact of eliminating the problems associable with a non-resistive load, where the reactive component of the power in the elements outside the power supply constitutes a source of dissipation within the power supply itself (reflected power);

the fact of obtaining, at resonance state, a good merit factor, marked by a high modulus of the equivalent impedance. Such situation minimizes the dissipative effects by the resistive elements both of the device and of the power supply circuit to the same;

the parasitic components, both inductive and capacitive (in practice non-eliminatable), are negligible given the high value of equivalent impedance of the device 2 intrinsically designed to resonate;

around the resonance frequency, a characteristic of the phase between voltage and current is obtained of monotonic type, which allows, by means of a vector measurement of the voltage and current, a simple and accurate determination of the resonance state.

The value 5 of the resonance frequency is a only due to the values of the inductive components and of the capacitive components of the device 2 intrinsically designed for resonating, suitable for RF power transfer, depending in an entirely negligible manner on the power supply circuit of the same.

The presence of a load, e.g. in the form of plasma or another material, within the work area 5c of the device 2, can vary both the resonance frequency and the merit factor of the device 2 itself, with respect to its idle running, still maintaining the operation as resonant circuit.

Advantageously, the above-described device 2 intrinsically designed to resonate, suitable for RF power transfer, can have a geometric configuration that is symmetric or asymmetric with respect to the its power supply terminals.

The electric field generated therein can be symmetric and balanced with respect to a ground or reference potential (13), asymmetric with respect to the ground or reference potential, or floating, i.e. unconstrained therefrom.

The operation of the above-described device 2 intrinsically designed to resonate, suitable for RF power transfer and of the group 1 is quite simple and reliable.

Underlying the present invention is the fact that the device 2 intrinsically designed to resonate, suitable for RF power transfer, is RF supplied at a frequency such that it freely starts to resonate.

The determination of such work frequency, corresponding to the resonance frequency of the device 2, can be obtained by suitably sizing the capacitive elements Cp and inductive elements Lp thereof, as a function of the work frequency of the RF power supply 3, and/or, vice versa, by power supplying the device 2 with a power supply with variable frequency until the resonance frequency is attained. By measuring the phase displacement between voltages and currents at the input of the device 2 intrinsically designed to resonate, by means of the above-described measurement means MM or other suitable equivalent means, the frequency of the RF power supply 3 is set at the value of the frequency at which the phase between voltage and current at the device 2 input is minimal (zero in optimal conditions).

For such purpose, the device 2 intrinsically designed to resonate and suitable for the above-described RF power transfer is advantageously and easily combinable with a system for the automatic adaptation of the frequency of the RF power supply 3, which however does not form part the present invention. Such combination is possible due to the monotonic nature of the function of the phase between voltage and current around the resonance frequency.

It is disclosed that preliminary laboratory tests indicate that it is possible to make the device 2 in a manner so as to obtain the resonance in a range of frequencies which range from hundreds of kHz to tens of MHz (30-40 MHz), with operating powers of any order of practical interest.

The above-described configurations of the device 2 intrinsically designed to resonate, suitable for RF power transfer, allow obtaining the resonance frequencies in a wide range of values. The device 2 also allows obtaining an electromagnetic field due only to the inductive elements L1, Lp or capacitive elements Cp.

Further advantages brought by the device 2 intrinsically designed to resonate, suitable for RF power transfer, according to the invention are reported hereinbelow.

First of all, since, during use, device 2 freely resonates, there is the possibility of power supplying it by means of a power supply with conventional switching, interposing only one series LC filter, also with low merit factor, between such power supply and the device 2.

It should also be noted that the device 2 intrinsically designed to resonate, suitable for RF power transfer, object of the invention, can have variable dimensions, comprised in a wide interval, on the order of several cm diameter and several cm length up to dimensions increased by a proportional factor ranging from 10 to 50.

With regard then to the sizing, from the standpoint of the electrical components of the device 2 intrinsically designed to resonate, suitable for RF power transfer, it is clear that it is possible to vary, in the second embodiment, the equivalent impedance, by modifying the turns ratio n1:n2 between the primary circuit and secondary circuit of the transformer 4.

It is also possible to vary the resonance frequency of the device 2, in the absence of load, by suitably sizing the inductive element Lp and capacitive element Cp of the device itself.

Analogously, in this case, it is possible to vary the merit factor of the device 2 intrinsically designed to resonate, suitable for RF power transfer, by varying the ratio Lp/Cp of the secondary circuit.

As mentioned above, a group comprising a device 2 intrinsically designed to resonate, suitable for RF power transfer as described above, can employ—as RF power supply—standard RF amplifiers with output impedance 50-75Ω or amplifiers suitably made with non-standard output impedances.

For such purpose, as can be inferred from the above-reported description, if the power supply in RF had a standard output impedance, typically comprised between 50 and 75Ω, it would be necessary to be able to modify the equivalent impedance of the device 2 intrinsically designed to resonate by bringing it to values that ensure, during use, the best possible coupling with regard to the RF power supply. Such action can be achieved by means of two expedients, also jointly applicable:
a) making a structure with transformer/autotransformer 4, without ferromagnetic core, with the primary circuit 6 power supplied by the RF power supply and secondary circuit 8 constituted by the resonant circuit LpCp; and/or
b) using an additional external transformer, voltage elevator, which can be made with the two-wire technique of the "balun" 1:n, mentioned above, or by means of other techniques used for RF transformers or autotransformers.

By employing solution (a), the resonance frequency substantially depends on the secondary circuit of the device 2, while the secondary/primary circuit n1:n2 turns ratio achieves the impedance adaptation. It is possible to obtain a wide range of values of the equivalent impedance seen at the primary circuit by varying the turns ratio between the primary and secondary circuits. The obtainment of one such structure varies the impedance modulus at the parallel resonance state of the secondary circuit, without significantly altering the value of such frequency.

With the equivalent transformer circuit, a second resonance condition is introduced, this time series condition, due to the dispersed inductance of the transformer, with higher frequency than the main parallel resonance. The more efficient the coupling between the primary and secondary circuits, the greater the second resonance frequency with respect to the first parallel resonance. With the decrease of the number of turns at the primary circuit, the series resonance frequency approaches the parallel resonance value. This is due to a worsened coupling between the primary and secondary circuits, with a consequent decrease of the efficiency of the transformer itself.

The optimal functioning point, for example for the possible generation of plasma, is at the parallel resonance state, easily manageable by any RF power supply given the high value of equivalent impedance of the device, of substantially resistive type, according to the present invention.

The series resonance state has an impedance modulus that is extremely low and hence critical for most of the RF amplifiers. With amplifiers of standard type (output impedance 50-75Ω), such condition is to be avoided, but nothing prohibits using the device 2 intrinsically designed for resonating and suitable for RF power transfer in such condition, with amplifiers with low output impedance, capable of delivering high currents.

If, even with the maximum turns ratio, between the primary circuit and the secondary circuit of the device, the impedance value should result too high with respect to the available RF power supply, one can recur to the solution (b). In order to not overly increase the turns ratio within the finding, it is convenient to utilize an additional impedance adaptation, attained by the additional transformer/autotransformer outside the device according to the invention.

It is possible to screen the device 2 by means of screens made of electrically conductive material and/or material with high magnetic permeability, placed at the reference electric potential or at floating potential.

With regard to the abovementioned prior art documents, it will be observed that in U.S. Pat. No. 6,291,938B1 (see FIGS. 2 and 6, lines 1-9 of column 3, lines 55-62 of column 6 and line 18 of column 9), reference is made to a system composed of a "resonant section" connected to a "non-resonant section", but the resonant section is said to include a winding, i.e. an inductance.

For such purpose, as is known, an inductance cannot resonate without a capacitive element electrically connected thereto in parallel or in series; hence, U.S. Pat. No. 6,291,938B1 clearly originates from an incorrect assumption.

In addition, U.S. Pat. No. 6,291,938B1 teaches that the "resonant section" can be connected to the RF power source by means of a "standard RF matching network", hence according to the common practice of the RF plasma sources of this type, i.e. without electrodes immersed in the plasma. The matching system is constituted by variable reactive elements (capacitances and/or inductances) which are connected to the antenna in order to ensure that the amplifier "sees" a resistive load with modulus equal to its output impedance (typically 50 or 75 Ohm, in order to ensure the maximum energy transfer from the amplifier to the antenna) and not a reactive load whose impedance modulus has a very small value, which it could not effectively manage. Such effect is obtained by creating a "distributed" resonance, i.e. the antenna, the matching system and the connection wires all resonate.

Nevertheless, in these conditions, very high currents circulate on the antenna and on the connection wires between the antenna itself and the matching system, having considered that the inductance of the antenna is considerably reduced and thus originates an impedance, at the operating frequencies, comparable with the parasitic elements of the wires and of other connection components; such high currents translate into high ohmic losses and therefore into reduced system efficiency, and in order to increase such efficiency it becomes critical to take particular care of the electrical connections, in some cases using active cooling systems.

Similar considerations can be made for US20040124779A1.

A device according to the present invention, unlike that taught by the aforesaid prior art documents, is instead intrinsically resonant and by exploiting capacitances—for example integrated in the support structure of the antenna (which is in any case an inductive winding) and/or its parasitic capacitances and/or an external capacitance, but directly connected to the terminals of the coil—it achieves a system that resonates without the need for additional elements, such as the matching boxes.

This ensures a considerable advantage with respect to the systems according to the state of the art, since in resonance the overall impedance of the system according to the present invention is very high with respect to the parasitic elements present in the connection elements (wires, etc.), which signifies that, of all the power delivered overall by the RF generator, most is absorbed by the resonant system, ensuring high efficiency. A device according to the present invention is also much less critical than the others from the standpoint of the electrical connections, given that the dissipation in such elements is any case negligible with respect to the power absorption of the resonant load.

In order to better explained that indicated above, as is known, for obtaining a high energy transfer efficiency for a resonant system, it is necessary to have a high merit factor which among other things depends on the value of the loss resistance Rs determined by the electrical connection wires. With regard to the Rs, its position inside the resonant circuit is clearly significant. If the Rs is situated between the RF power amplifier and the resonant circuit (as according to the present invention), at resonance state, the loss resistance (connection wires) is traversed by the current absorbed by the resonant circuit, which is found to have a high impedance modulus (indeed because it works in resonance).

If the Rs is situated between the chord capacitances (matching box) and the inductive element of the resonant circuit (as according to the state of the art), also in resonance conditions, it is traversed by the exchange current between the inductance and the capacitance, which is higher, given the same resonance frequency, the smaller the value of the inductance and certainly greater than the current absorbed by the resonant system overall.

In the prior art devices, where the inductive element of the resonant circuit is situated in a remote position with respect to the resonance capacitance, the line section between the matching box and the inductive element is traversed by the exchange current between L and C and the presence of the resistance Rs generates a considerable dissipation. The only way to reduce such dissipation in the prior art devices—with consequent increase of the merit factor—consists of reducing the value of Rs, but there are limits due to the wire resistances, the contact resistances of the connectors and the skin effect of the conductors.

In the case of a device according to the present invention, the intrinsically resonant circuit does not require the matching box and the entire line section between the RF amplifier and the intrinsically resonant device is traversed by a current that is not high, indeed because the parallel resonant circuit (which equates to a device according to the present invention) at resonance state has maximum modulus of its impedance. Given the same Rs, the effect of such impedance, with respect to the configuration of the previous devices, is negligible.

In consideration of that stated above, it will be observed that the solution underlying the present invention—which provides for stabilizing a capacitive element and an inductive element with values such to generate, at resonance state, an equivalent impedance, measured at the terminals of the device, substantially of resistive type and much greater than the value of the parasitic impedance upstream of the terminals of the device, such that the effect of the parasitic impedance is, during use, substantially negligible—in addition to being differentiated with respect to the previously-proposed solutions, is also inventive with respect thereto.

Indeed, in order to improve the merit factor of systems such as those of U.S. Pat. No. 6,291,938B1 and US20040124779A1, the man skilled in the art, on the basis of that indicated above, would decrease or would attempt to decrease the resistance of the conductors and would not be induced to operate on the capacitive or inductive elements in order to obtain, at resonance state, an equivalent impedance greater than the value of the parasitic impedance upstream of the terminals of the device.

With regard to such aspect, none of the above-mentioned prior art documents in fact teaches to employ one such solution; moreover, there are intrinsic constraints in the values of L and C in the systems of such documents, so that the parasitic capacitances of the wires of the prior art solutions are added to the resonance capacitance and hence impose the limit of not being able to increase the inductance of the coil beyond a certain limit, otherwise the actual resonance frequency would be decreased, considering that the same (as mentioned above) is equal to 1 over the square root of the inductance times the capacitance.

Clearly, the variation of the resonance frequency must be prevented as much as possible, especially if the amplifier is unable—as often happens—to tolerate or support changes of the same.

In addition, tuning, i.e. varying the capacitances, of a system like that of the above-commented prior art documents, is rather complicated and involves the presence of non-resistive transient loads on the amplifier, causing the onset of so-called reflected power towards the amplifier itself, so that one would at least have to over-size the amplifier. Hence, it will be understood that the man skilled in the art not only would not have discovered suggestions in the state of the art to modify the previously-proposed solutions so as to arrive at the invention, object of the present patent application, but—also for that stated above—he would have been dissuaded even from merely hypothesizing such solution.

Similar considerations are applied to a group, to an apparatus and to a method according to the present invention, in particular the method according to which the phase displacement is measured between the voltage and the current at the input of the device and if the phase displacement is non-zero, the frequency of the power supply is adjusted until the measured phase displacement is substantially zero—a method that is neither taught nor even suggested by the state of the art.

The invention thus conceived is susceptible of numerous modifications and variations within the protective scope defined by the following claims.

Hence, for example, there is the possibility to jointly apply the volt-amperometric measurement module and the signal waveform adaptation circuit, both with the device with simple resonant LC circuit according to the first embodiment of the present invention, and with the device with transformer or autotransformer structure with secondary resonant LC circuit, according to the second embodiment of the present invention.

In addition, in practice the materials employed, so long as they are compatible with the specific use, as well as the sizes and shapes, can be of any type in accordance with the application and/or structural requirements.

In addition, the aforesaid value of the ratio n2/n1 is approximate and relative to devices having a support structure 5 internally delimiting a work area 5c with volume up to hundreds of cubic cm and power suppliable by standard amplifiers with output impedance of 50-75Ω and 100-200 W power. It can be reasonably confirmed that, since there is no pre-established constraint for such turns ratio, the device according to the present invention allows adapting different RF amplifiers to different configurations of a gaseous source for plasma production, given that the best possible coupling can be attained between the RF power supply and the device in accordance with the type of plasma to be obtained.

In addition, all details can be substituted by other technically equivalent elements, with the same functionality, even if with different structural modes.

The invention claimed is:

1. A device intrinsically designed to resonate, suitable for RF power transfer, and producing plasma, and electrically connectable downstream of a radio frequency power supply having fixed or variable frequency, the device comprising:
at least one inductive element (Lp) directly connected to and powered, in use, by said radio frequency power supply at a second set of terminals, and electrically connected to a first set of terminals of said device;
at least one capacitive element (Cp), electrically connected at the second set of terminals of said at least one inductive element (Lp) and to said first set of terminals of said device;
said device having a resonance angular frequency equal to $$\omega o = \frac{1}{\sqrt{LpCp}}$$

wherein said at least one capacitive element (Cp) and said at least one inductive element (Lp) each have values such that, at resonance state, they provide an equivalent impedance, measured at the first set of terminals of said device, substantially of the resistive type and much higher than a parasitic impedance upstream of the first set of terminals of said device, such that an effect of said parasitic impedance is, in use, substantially negligible.

2. The device according to claim 1, wherein the at least one inductive element (Lp) powered directly by said radio frequency power supply without interposition of additional electrical components.

3. The device according to claim 1, comprising at least one transformer or autotransformer including in turn:
one primary circuit of said one transformer or autotransformer, provided with at least one coil (L1) of n1 turns, and
one secondary circuit provided with at least one inductive element (Lp) having n2 turns, said coil (L1) of said primary circuit being directly powerable by said radio frequency power supply.

4. The device according to claim 3, wherein a ratio between said n2 turns of said at least one inductive element (Lp) and said n1 turns of said at least one coil (LI) is equal to or greater than 5, if said device is directly electrically connected at a set of output terminals of the radio frequency power supply an output voltage between 50V and about 200V.

5. The device according to claim 3, wherein a ratio between said n2 turns of said at least one inductive element (Lp) and said n1 turns of said at least one coil (LI) is less than 5, if said device is directly electrically connected at a set of output terminals of the radio frequency power supply having an output voltage greater than 100V.

6. The device according to claim 1, comprising:
at least one support structure made of electrically insulating material, the at least one support structure comprising one internal surface and one external surface,
said support structure delimiting internally a working area for said device.

7. The device according to claim 6, wherein said at least one inductive element (Lp) is supported by said support structure, longitudinally around and in contact therewith.

8. The device according to claim 7, wherein said at least one capacitive element (Cp) comprises an external capacitor electrically connected to said at least one inductive element (Lp) and supported externally and at a distance from said support structure.

9. The device according to claim 8, wherein said external capacitor comprises rheophores that are directly connected without interposition of further electrical components, at the set of terminals of said at least one inductive element.

10. The device according to claim 9, wherein said rheophores have section of 10-20 mm$^2$ with length less than or equal to about 10-15 cm.

11. The device according to claim 6, wherein said at least one capacitive element (Cp) is integrated within said at least one support structure.

12. The device according to claim 11, wherein the said at least one capacitive element (Cp) comprises at least one couple of laminar elements made of electrically conductive material, which are applied to said at least one support structure at one end thereof and on opposite sides thereof, said laminar elements thereby forming two plates of a capacitor (C'x) with dielectric material there between.

13. The device according to claim 12, wherein said laminar elements made of conductive material are cut longitudinally in order to avoid short circuit coils.

14. The device according to claim 6, wherein said at least one capacitive element (Cp) comprises:
two couples of laminar elements made of electrically conductive material, one applied to the internal surface and one applied to the external surface of said at least one support structure,
each couple of said laminar elements being applied at one end of said support structure and being electrically connected in series to the other couple, by means of at least one connection element made of electrically conductive material,
said couples thereby forming two capacitors (C'x) with dielectric material therebetween and being electrically connected in series at the set of terminals of said at least one inductive element (Lp).

15. The device according to claim 6, wherein said at least one capacitive element (Cp) is given by a parasitic capacitance (Cx) of said at least one inductive element (Lp).

16. The device according to claim 6, comprising:
at least one laminar electrode applied to said at least one support structure at one end thereof and electrically connected to said at least one inductive element (Lp), said at least one laminar electrode being powerable at an electric potential which is synchronous or possibly out-of-phase with respect to a feeding voltage of said device.

17. The device according to claim 6, comprising at least one wire-like electrode, axially supported inside said at least one support structure in said working area.

18. The device according to claim 6, wherein said at least one inductive element (Lp) is supported by the internal surface and/or by the external surface of said at least one support structure.

19. The device according to claim 6, wherein said at least one inductive element (Lp) comprises one or more layers, each layer being supported and/or by the external surface by the said at least one support structure.

20. The device according to claim 6 comprising:
at least one transformer or autotransformer including in turn:
one primary circuit of said one transformer or autotransformer, provided with at least one coil (L1) of n1 turns, and
one secondary circuit provided with at least one inductive element (Lp) having n2 turns, said coil (L1) of said primary circuit being directly powerable by said radio frequency power supply,
wherein said coil (LI) is supported by the external surface of said at least one support structure.

21. The device according to claim 20, comprising connection means for electrical connection with said radio frequency power supply, provided at the ends of said coil (L1).

22. The device according claim 1, wherein said at least one capacitive element (Cp) can be obtained with one or more capacitors connected in series and/or in parallel.

23. The device according to claim 1, wherein said at least one inductive element (Lp) comprises one or more inductors connected in series and/or in parallel.

24. A group for power transfer, comprising:
at least one radio-frequency (RF) power supply operating at fixed or variable frequency;
the device intrinsically designed to resonate as claimed in claim 1 and electrically connected to said at least one radio frequency power supply.

25. The group according to claim 24, comprising at least one measurement means (MM), connected between said at least one radio-frequency power supply and said at least one device, designed to measure a phase displacement between a voltages and a current generated by said at least one radio frequency power supply at an input of said device.

26. The group according to claim 24, comprising at least one adapter module (AS), connected between said at least one radio-frequency power supply and said at least one device, said adapter module (AD) comprising at least a series resonant LC filter, said at least one radio-frequency power supply being a square wave switching power supply.

27. The group according to claim 24, comprising one device wherein at least one inductive element (Lp) is powered directly by said at least one radio frequency power supply without interposition of additional electrical components.

28. A method of operating a group for power transfer in radio-frequency, comprising the following steps of:
arranging the group according to claim 24; and
supplying power to said at least one device of said group at a frequency substantially corresponding to the resonance frequency of said at least one device.

29. The method according to claim 28 adapted to select a component of said at least one device such that a resonant frequency of said device corresponds to a working frequency of said at least one radio-frequency power supply.

30. The method according to claim 28, wherein the step of supplying power to said at least one device at one frequency corresponding to the resonance frequency of said at least one device, requires a sub-step of selecting, in a range of frequencies which can be generated by said at least one radio-frequency power supply, a frequency corresponding to the resonance frequency of said at least one device.

31. The method according to claim 30, wherein said sub-step of selecting, in the range of frequencies that can be generated by said at least one radio-frequency power supply, the frequency corresponding to the resonance frequency of said at least one device comprises:
measuring a phase displacement between a voltage and a current in input to said at least one device; and
adjusting the frequency of the said power supply, if said phase displacement is not zero, until said measured phase displacement is substantially zero.

32. An apparatus for plasma production starting from gas, comprising:
at least one group according to claim 24;
feeding means of said gas into said at least one device;
one gas input port;
one plasma output port; and
one working area extending from said input port to said output port.

33. The apparatus according to claim 32,
wherein the group-comprises at least one device including a support structure,
wherein the apparatus further comprises a focusing means, and
wherein said feeding means and said focusing means are arranged at opposite sides of said support structure.

34. The apparatus according to claim 32, comprising plasma focusing means at the plasma output port of the said device, said focusing means comprising one or more windings which can be power supplied with direct current.

35. The apparatus according to claim 32, wherein said apparatus operates, in use, at one frequency substantially equal to a resonance frequency of said device when, in said working area said gas is fed.

* * * * *